US010613930B2

(12) United States Patent
Hashimoto et al.

(10) Patent No.: US 10,613,930 B2
(45) Date of Patent: *Apr. 7, 2020

(54) GLOBAL ERROR RECOVERY SYSTEM

(71) Applicant: TOSHIBA MEMORY CORPORATION, Tokyo (JP)

(72) Inventors: Daisuke Hashimoto, Cupertino, CA (US); Hironori Uchikawa, Fujisawa Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 53 days.

This patent is subject to a terminal disclaimer.

(21) Appl. No.: 15/954,535

(22) Filed: Apr. 16, 2018

(65) Prior Publication Data
US 2018/0232274 A1 Aug. 16, 2018

Related U.S. Application Data

(63) Continuation of application No. 15/011,452, filed on Jan. 29, 2016, now Pat. No. 9,946,596.

(51) Int. Cl.
*G06F 11/10* (2006.01)
*G11C 29/52* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .................................................. G06F 11/1076
(Continued)

(56) References Cited

U.S. PATENT DOCUMENTS 7,310,702 B2 * 12/2007 Yamagami ............ G06F 3/0605
711/112
7,873,782 B2    1/2011 Terry et al.
(Continued)

FOREIGN PATENT DOCUMENTS

WO    2013065334 A1    5/2013
WO    2014039845 A1    3/2014
(Continued)

OTHER PUBLICATIONS

Young-Sik Lee et al., "OSSO: A Case for Object-Based Solid State Drives", MSST 2013, 43 pages.
(Continued)

*Primary Examiner* — Fritz Alphonse
(74) *Attorney, Agent, or Firm* — Kim & Stewart LLP

(57) ABSTRACT

In a network storage device that includes a plurality of data storage drives, error correction and/or recovery of data stored on one of the plurality of data storage drives is performed cooperatively by the drive itself and by a storage host that is configured to manage storage in the plurality of data storage drives. When an error-correcting code (ECC) operation performed by the drive cannot correct corrupted data stored on the drive, the storage host can attempt to correct the corrupted data based on parity and user data stored on the remaining data storage drives. In some embodiments, data correction can be performed iteratively between the drive and the storage host. Furthermore, the storage host can control latency associated with error correction by selecting a particular error correction process.

20 Claims, 20 Drawing Sheets

(51) Int. Cl.
*H03M 13/11* (2006.01)
*G06F 3/06* (2006.01)
*H03M 13/29* (2006.01)
*G11C 29/04* (2006.01)
*H03M 13/13* (2006.01)
*H03M 13/15* (2006.01)
*H03M 13/19* (2006.01)

(52) U.S. Cl.
CPC ........ *G06F 3/0688* (2013.01); *G06F 11/1048* (2013.01); *G11C 29/52* (2013.01); *H03M 13/1102* (2013.01); *H03M 13/293* (2013.01); *H03M 13/2909* (2013.01); *G11C 2029/0411* (2013.01); *H03M 13/13* (2013.01); *H03M 13/152* (2013.01); *H03M 13/19* (2013.01)

(58) Field of Classification Search
USPC ........................................................ 714/764
See application file for complete search history.

(56) References Cited

U.S. PATENT DOCUMENTS

| | | | |
|---|---|---|---|
| 8,032,724 | B1 | 10/2011 | Smith |
| 8,041,878 | B2 | 10/2011 | Lee |
| 8,239,724 | B2 | 8/2012 | Swing et al. |
| 8,363,349 | B2 | 1/2013 | Haga et al. |
| 8,364,918 | B1 | 1/2013 | Smith |
| 8,412,978 | B2 | 4/2013 | Flynn et al. |
| 8,418,042 | B2 | 4/2013 | Kanno |
| 8,484,542 | B2 | 7/2013 | d'Abreu et al. |
| 8,495,467 | B1 | 7/2013 | Billing et al. |
| 8,539,315 | B2 | 9/2013 | Hashimoto |
| 8,631,191 | B2 | 1/2014 | Hashimoto |
| 8,635,513 | B1 | 1/2014 | Au et al. |
| 8,656,101 | B2 | 2/2014 | Werner et al. |
| 8,874,872 | B2 | 10/2014 | Feldman et al. |
| 8,935,302 | B2 | 1/2015 | Flynn et al. |
| 8,984,375 | B2 | 3/2015 | Hashimoto |
| 9,026,734 | B2 | 5/2015 | Hashimoto |
| 9,026,764 | B2 | 5/2015 | Hashimoto |
| 9,274,942 | B2 | 3/2016 | Hashimoto |
| 2002/0144048 | A1* | 10/2002 | Bolt ........................ G06F 3/061 711/4 |
| 2003/0225966 | A1* | 12/2003 | Frandsen ............ G06F 11/1456 711/111 |
| 2011/0113194 | A1 | 5/2011 | Terry et al. |
| 2011/0239081 | A1 | 9/2011 | Hida et al. |
| 2013/0159785 | A1 | 6/2013 | Hashimoto |
| 2013/0238838 | A1 | 9/2013 | Fukutomi et al. |
| 2014/0047281 | A1 | 2/2014 | Masuo et al. |
| 2014/0215129 | A1 | 7/2014 | Kuzmin et al. |
| 2014/0297776 | A1 | 10/2014 | Volvovski et al. |
| 2014/0365719 | A1 | 12/2014 | Kuzmin et al. |
| 2015/0074371 | A1 | 3/2015 | Hashimoto et al. |
| 2015/0089179 | A1 | 3/2015 | Kurita et al. |
| 2015/0331624 | A1 | 11/2015 | Law |
| 2015/0347025 | A1 | 12/2015 | Law |
| 2015/0355974 | A1 | 12/2015 | Hayes et al. |
| 2018/0024877 | A1* | 1/2018 | Gold ................... G11C 11/5628 714/773 |
| 2018/0173442 | A1* | 6/2018 | Kirkpatrick ............ G06F 3/064 |

FOREIGN PATENT DOCUMENTS

| | | |
|---|---|---|
| WO | 2014039922 A2 | 3/2014 |
| WO | 2014147865 A1 | 9/2014 |

OTHER PUBLICATIONS

Matias Bjorling, "Open-Channel Solid State Drives", Vault, Mar. 12, 2015, 22 pages.
Matias Bjorling, "Linux Kernel Abstractions for Open-Channel Solid State Drives", Non-Volatile Memories Workshop, Mar. 1, 2015, 10 pages.
NVM Express, Revision 1.2, Nov. 3, 2014, 205 pages.
Storage Intelligence Proposal, Revision 6, Mar. 10, 2015, 56 pages.
Shin-Ichi Kanno et al, "Theoretical Write Amplification Analysis of the SSD", Technical Report of IEICE, Oct. 10, 2014, 2 pages.
Andrea C. Arpaci-Dusseau et al., "Removing the Costs of Indirection in Flash-Based SSDs with Nameless Writes", USENIX HotStorage 2010, Jun. 22, 2010, 32 pages.
Yiying Zhang et al, "De-indirection for Flash-Based SSDs with Nameless Writes", USENIX FAST 2012, Feb. 7, 2012, 16 pages.

\* cited by examiner

Read Command

| Field | Description | | | |
|---|---|---|---|---|
| LBA | Logical Block Address to be read | | | |
| Sector size | Sector size of read data | | | |
| Data Transfer Direction | From drive to host | | | |
| ECCCAP | ECC Decode Capability | | | |
| | ECC Capability | Level 1 ECC | Level 3 ECC | Description |
| | 0h | default | default | default |
| | 1h | 1 | 0 | Level 1 ECC only |
| | 2h | 0 | 1 | Level 3 ECC only |
| | 3h | 1 | 1 | Level 1 and 3 ECC |

Extended Data Request Command

| Field | Description | | | |
|---|---|---|---|---|
| LBA | Logical Block Address to be read | | | |
| Transfer Length | Transfer Length of read data | | | |
| Data Transfer Direction | From drive to host | | | |
| ECCCAP | ECC Decode Capability | | | |
| | ECC Capability | Level 1 ECC | Level 3 ECC | Description |
| | 0h | default | default | default |
| | 1h | 1 | 0 | Level 1 ECC only |
| | 2h | 0 | 1 | Level 3 ECC only |
| | 3h | 1 | 1 | Level 1 and 3 ECC |

FIG. 6F

Extended Read Command

| Field | Description | | | |
|---|---|---|---|---|
| LBA | Logical Block Address to be read | | | |
| Transfer Length | Transfer Length of read data | | | |
| Data Transfer Direction | From drive to host | | | |
| ECCCAP | ECC Decode Capability | | | |
| | ECC Capability | Level 1 ECC | Level 3 ECC | Description |
| | 0h | default | default | default |
| | 1h | 1 | 0 | Level 1 ECC only |
| | 2h | 0 | 1 | Level 3 ECC only |
| | 3h | 1 | 1 | Level 1 and 3 ECC |

Error Correction Request Command

| Field | Description | | | |
|---|---|---|---|---|
| LBA | Logical Block Address to be read | | | |
| Transfer Length | Transfer Length of read data | | | |
| Data Transfer Direction | Bi-directional (From host to drive and from drive to host) | | | |
| ECCCAP | ECC Decode Capability | | | |
| | ECC Capability | Level 1 ECC | Level 3 ECC | Description |
| | 0h | default | default | default |
| | 1h | 1 | 0 | Level 1 ECC only |
| | 2h | 0 | 1 | Level 3 ECC only |
| | 3h | 1 | 1 | Level 1 and 3 ECC |

FIG. 6G

GLOBAL ERROR RECOVERY SYSTEM

CROSS-REFERENCE TO RELATED APPLICATIONS

This application is a continuation of U.S. patent application Ser. No. 15/011,452, filed Jan. 29, 2016, the contents of which are incorporated herein by reference.

BACKGROUND

The use of distributed computing systems, in which multiple separate computers perform computation problems or information processing, is becoming increasingly widespread. In distributed computing systems for enterprise applications, banks or arrays of data storage devices are commonly employed to facilitate large-scale data storage for a plurality of hosts or users. Because latency is a significant issue in such computing systems, solid-state drives (SSDs) are commonly used as data storage devices, since data can be written to and read from the flash memory cells typically used in an SSD very quickly. Furthermore, solid-state memory technologies currently under development, such as TLC flash (with three bits per cell) and QLC flash (with four bits per cell) have the potential to further improve the performance, cost, and energy efficiency of SSDs.

However, in addition to improved performance, TLC flash, QLC flash, and the like are generally subject to higher bit-error rates. Consequently, SSDs that include these solid-state memory technologies may employ more robust error-correcting code (ECC) methods, for example low-density parity-check (LDPC) code. Unfortunately, such ECC methods typically include complex algorithms that generally increase latency and are implemented with larger circuits that increase the cost and power consumption of an SSD.

SUMMARY

One or more embodiments provide systems and methods for error correction in a network storage device that includes a plurality of data storage drives. According to the embodiments, error correction and/or recovery of data stored on one of the plurality of data storage drives is performed cooperatively by the drive itself and by a storage host that is configured to manage storage in the plurality of data storage drives. Specifically, when an error-correcting code (ECC) operation performed by the drive cannot correct corrupted data stored on the drive, the storage host can attempt to correct the corrupted data based on parity and user data stored on the remaining data storage drives. In some embodiments, data correction can be performed iteratively between the drive and the storage host. Furthermore, in some embodiments, the storage host can control latency associated with error correction by selecting a particular error correction process.

A memory system, according to embodiments, comprises a plurality of data storage drives and a storage host. Each of the data storage drives has a controller configured to perform error correction. The storage host includes a processor configured to receive error-corrected data from each of the data storage drives and to perform further error correction on error-corrected data received from one of the data storage drives using the error-corrected data received from the data storage drives.

Further embodiments provide a method of error correction in a data storage device that includes a plurality of data storage drives and a storage host with a processor configured to receive error-corrected data from each of the data storage drives. The method comprises the steps of transmitting a read command to a target drive of the plurality of data storage drives for target data stored in the target drive, receiving, in response to the read command, notification from the target drive that the target data are uncorrectable, in response to the notification from the target drive, transmitting a read command to each of the remaining data storage drives of the plurality of data storage drives, receiving, in response to each of the read commands transmitted to each of the remaining data storage drives, error-corrected user data and error-corrected parity data, and performing error correction on the target data using the error-corrected user data and the error-corrected parity data to produce error-corrected target data.

Further embodiments provide a method of error correction in a data storage device that includes a plurality of data storage drives and a storage host with a processor configured to receive error-corrected data from each of the data storage drives. The method comprises the steps of transmitting a read command to a target drive of the plurality of data storage drives for target data stored in the target drive, receiving, in response to the read command, notification from the target drive that the target data are uncorrectable, determining that a current workload of the processor is greater than a predetermined threshold, and transmitting a soft decode request to the target drive for the target data.

BRIEF DESCRIPTION OF THE DRAWINGS

FIGS. 6F-6G illustrate formats of commands issued by a storage host to the data storage server of FIG. 1, according to an embodiment.

DETAILED DESCRIPTION

First Embodiment

Figure 1:
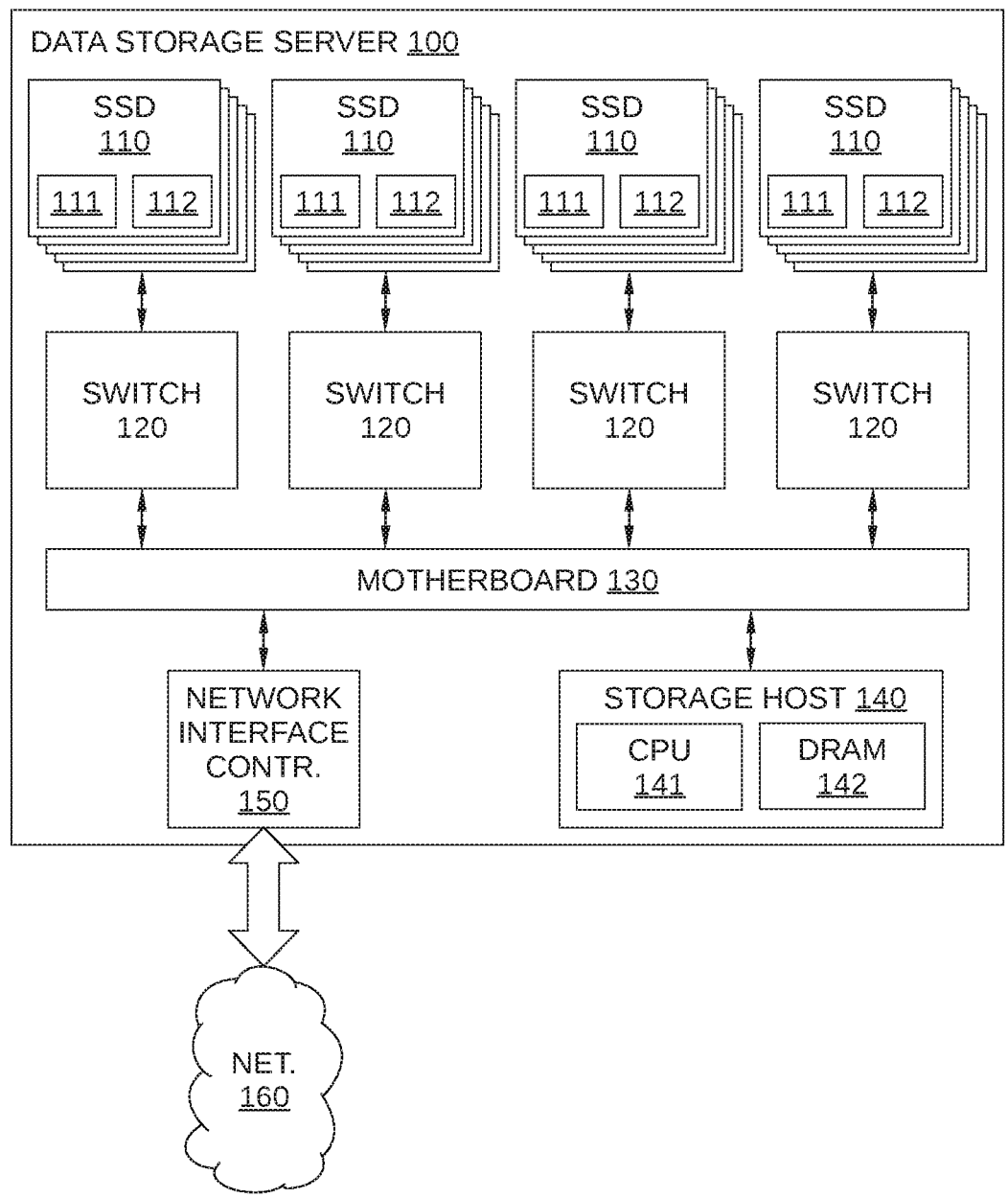
FIG. 1 schematically illustrates a data storage server, configured according to a first embodiment.

FIG. 1 schematically illustrates a data storage server 100, configured according to a first embodiment. Data storage server 100 is suitable for use as part of an enterprise or large-scale data storage system, such as a storage area network (SAN), network-attached storage (NAS) and hyper-converged storage. Data storage server 100 includes a plurality of solid-state drives (SSDs) 110 that may be coupled in groups by switches 120 (e.g., PCIe switches and SAS expander) to a motherboard 130. For example, SSD 110 is connected to switch 120 via serial ATA (SATA) interface, serial attached SCSI (SAS) interface, or PCI Express (PCIe) interface. Data storage server 100 also includes a storage host 140 and a network interface controller 150, which are also each coupled to motherboard 130. Data storage server 100 may be configured as a rack-mounted (modular) storage server that is connected to one or more computing nodes and/or data storage nodes via network fabric 160. For example, in some embodiments, data storage server 100 is configured as a "4U" appliance having a height of four rack units and dimensions suitable for mounting in a standard electronic equipment mounting frame. Network fabric 160 may be any high-speed interconnect, such as a 40 Gb Ethernet or 40G Infiniband connection.

In the embodiment illustrated in FIG. 1, data storage server 100 is depicted with 20 SSDs 110. In practice, data storage server 100 may include as many as dozens or hundreds of SSDs 110. Furthermore, in some embodiments, data storage server 100 may be configured with hard disk drives instead of or in addition to SSDs.

Each SSD 110 is configured as a data storage element of data storage server 100, and includes a non-volatile memory 111 and a controller 112. Non-volatile memory 111 may include one or more solid-state memory devices, such as a NAND flash chip or other flash memory device. Controller 112 is configured to control write, read, and erase operations with respect to non-volatile memory 111 and to implement error correction operations as described herein.

Storage host 140 includes a CPU 141 and DRAM 142, and is configured to manage data storage in SSDs 110. Application programs and/or data analytics programs associated with data storage server 100 may instead be run on a computing node connected to data storage server 100 by network fabric 160. CPU 141 may be implemented as a processor chip, an application-specific integrated circuit (ASIC), a field programmable gate array (FPGA), or other type of processing unit, or a combination of different processing units. DRAM 142 may be any suitable memory device, and is coupled to CPU 141 to facilitate operation of CPU 141. In some embodiments, DRAM 142 includes one or more volatile solid-state memory devices, such as one or more dynamic RAM (DRAM) chips.

According to some embodiments, multiple error correcting code (ECC) schemes may be implemented to correct errors in data stored in data storage server 100, hereinafter referred to as "Level 1 decoding," "Level 2 decoding," "Level 2.5 decoding," "Level 3 decoding," "Level 4 decoding," and "Level 4.5 decoding." Level 1 decoding refers to intra-drive ECC, in which correction of errors detected in an SSD 110 is attempted by the SSD 110 using hard decoding of parity data and user data stored in the SSD 110. Level 2 decoding refers to inter-drive ECC, in which storage host 140 attempts to correct the errors using hard decoding of parity data and user data stored in other SSDs of data storage server 100. Level 2.5 decoding refers to global error correction, in which storage host 140 attempts to correct the errors using hard decoding of global parity data stored in data storage server 100 and of parity data and user data stored in other SSDs of data storage server 100. Level 3 decoding refers to intra-drive ECC, in which correction of errors detected in an SSD 110 is attempted by the SSD 110 using soft decoding of parity data and user data stored in the SSD 110. Level 4 decoding refers to inter-drive ECC, in which storage host 140 attempts to correct the errors using soft decoding of parity data and user data stored in other SSDs of data storage server 100. Level 4.5 decoding refers to global error correction, in which storage host 140 attempts to correct the errors using soft decoding of global parity data stored in data storage server 100 and of parity data and user data stored in other SSDs of data storage server 100.

According to some embodiments, error correction in data storage server 100 may iterate between two or more these ECC schemes, thereby enhancing the robustness of error correction in data storage server 100. For example, an SSD 110 may perform Level 1 decoding on data stored in the SSD 110 when errors are detected therein, followed by storage host 140 performing Level 2 decoding on the data if the Level 1 decoding is unsuccessful. If the Level 2 decoding is also unsuccessful and the data are only partially corrected, error correction then returns to the SSD 110, which performs Level 1 decoding on the partially corrected data. Other error correction procedures that iterate between execution on an individual SSD 110 and on storage host 140 are also described herein.

Figure 2:
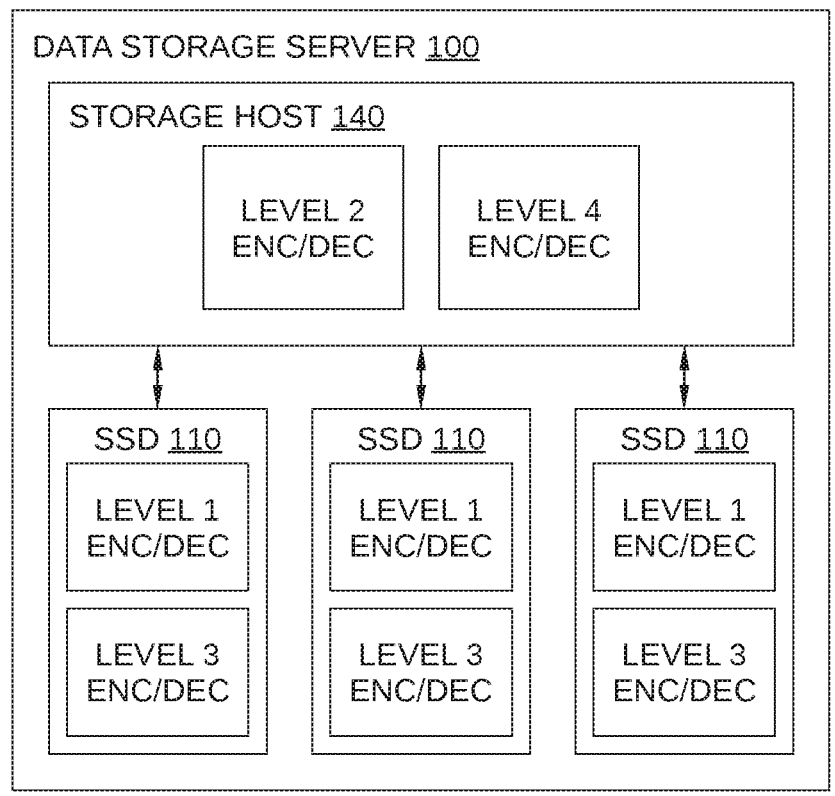
FIG. 2 schematically illustrates a configuration of ECC decoding schemes in the data storage server of FIG. 1, according to an embodiment.
Figure 3:
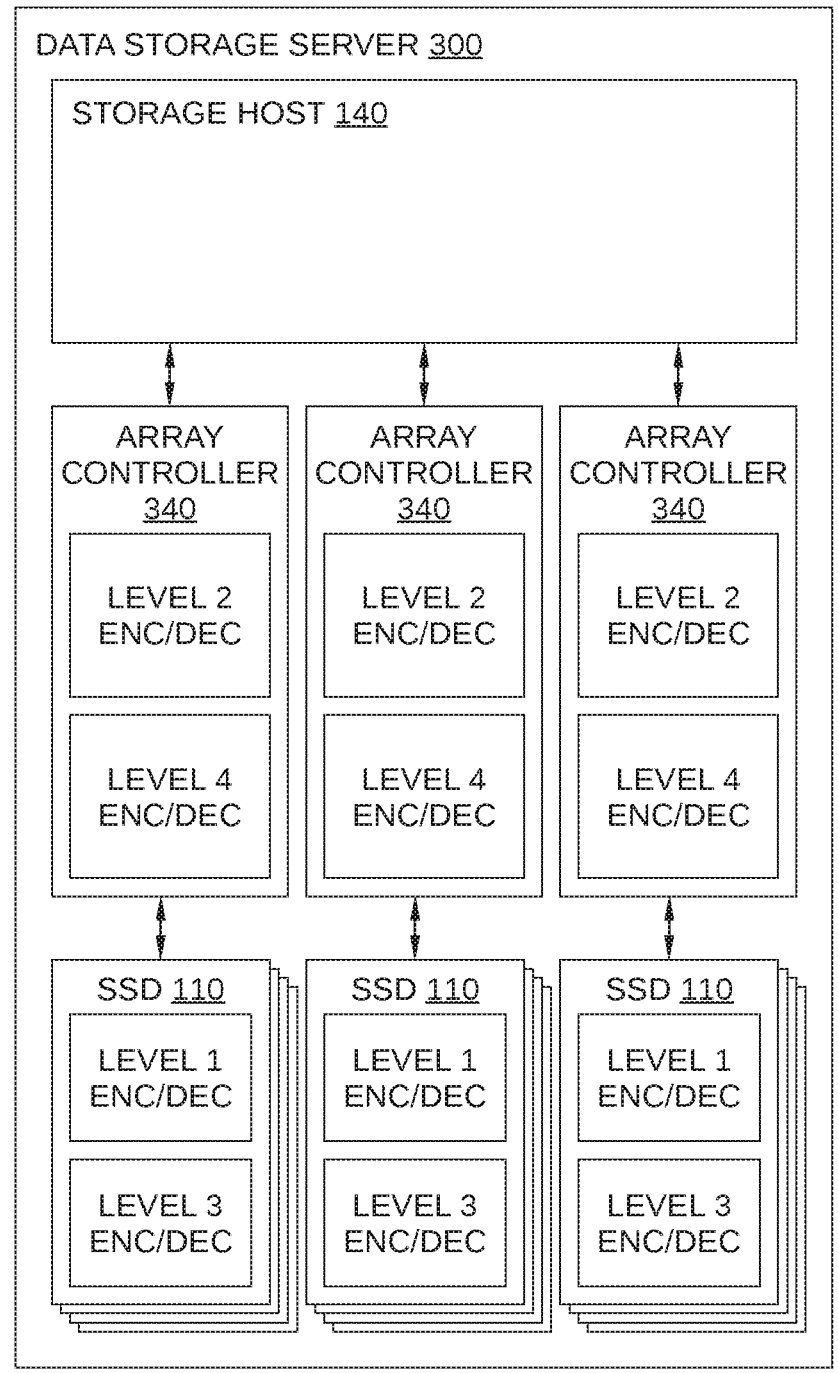
FIG. 3 schematically illustrates a configuration of ECC decoding schemes in a data storage server, according to another embodiment.

FIG. 2 schematically illustrates a configuration of ECC decoding schemes in data storage server 100, according to an embodiment. As shown, in such an embodiment, storage host 140 is configured with level 2 encoding/decoding and level 4 encoding/decoding capability, and each SSD 110 is configured with level 1 encoding/decoding and level 3 encoding/decoding capability. Alternatively, in some embodiments, data storage server 100 may include one or more array controllers that include encoding/decoding capability. One such embodiment is illustrated in FIG. 3. FIG. 3 schematically illustrates a configuration of ECC decoding schemes in a data storage server 300, according to another embodiment. As shown, in such an embodiment, data storage server 300 includes multiple array controllers 340, each configured with level 2 encoding/decoding and level 4 encoding/decoding capability. Each SSD 110 is configured with level 1 encoding/decoding and level 3 encoding/decoding capability.

Figure 4:
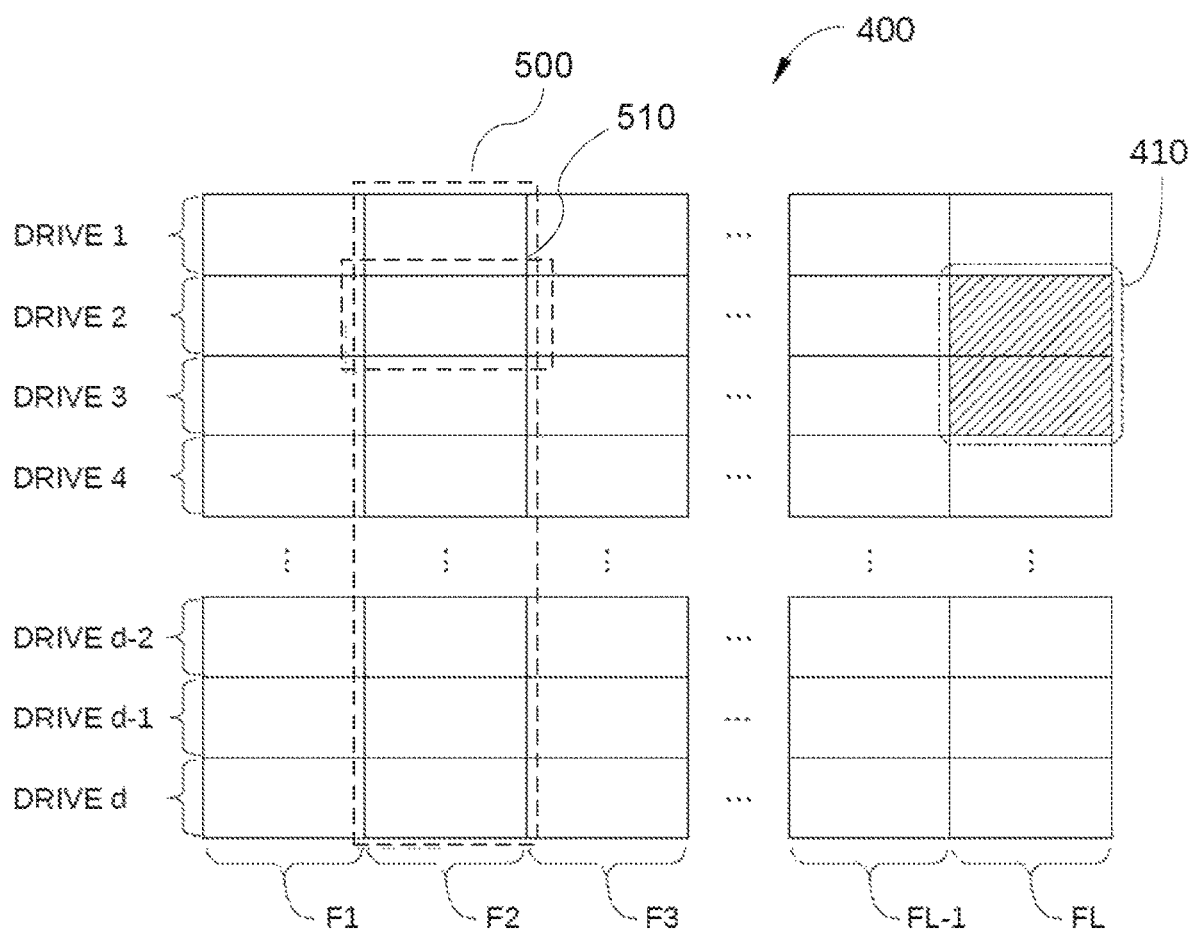
FIG. 4 schematically illustrates a data format that may be implemented in the data storage server of FIG. 1, according to an embodiment.

FIG. 4 schematically illustrates a data format 400 that may be implemented in data storage server 100, according to an embodiment. Data format 400 includes a total of L frames (frames F1-FL) that each subdivide the storage volumes of the SSDs 110 in data storage server 100. In the embodiment illustrated in FIG. 4, data storage server 100 includes a total of d SSDs (i.e., drives 1-$d$). The frame is an ECC unit of Level 1 ECC. Since each of frames F1-FL (one of which is labeled in FIG. 4 as frame 500) includes a portion of each of the d drives, data format 400 facilitates the use of a product code-based ECC scheme in data storage server 100. Specifically, in data format 400, data are stored in blocks that are organized within each of drives 1-$d$ (arranged as rows in FIG. 4) and also orthogonally within each of frames F1-FL (arranged as columns in FIG. 4), resulting in a rectangular data array that can be used to implement a product code-based ECC scheme. In addition, in some embodiments, data format 400 can facilitate the storage of global parity data 410 that can be employed by global (i.e., server-wide) erasure encoding for global erasure recovery (i.e., recovery of data erased from anywhere in data storage server 100).

Product code is a technique to form a long length code with higher ECC capabilities using small length constituent codes. With product code, a linear code can be formed where each codeword can be arranged in a rectangular array of columns and rows such that every row is a codeword in a first linear code and every column is a codeword in a second linear code. It is noted that product code generally involves both row parity and column parity values, as illustrated in FIG. 5.

Figure 5:
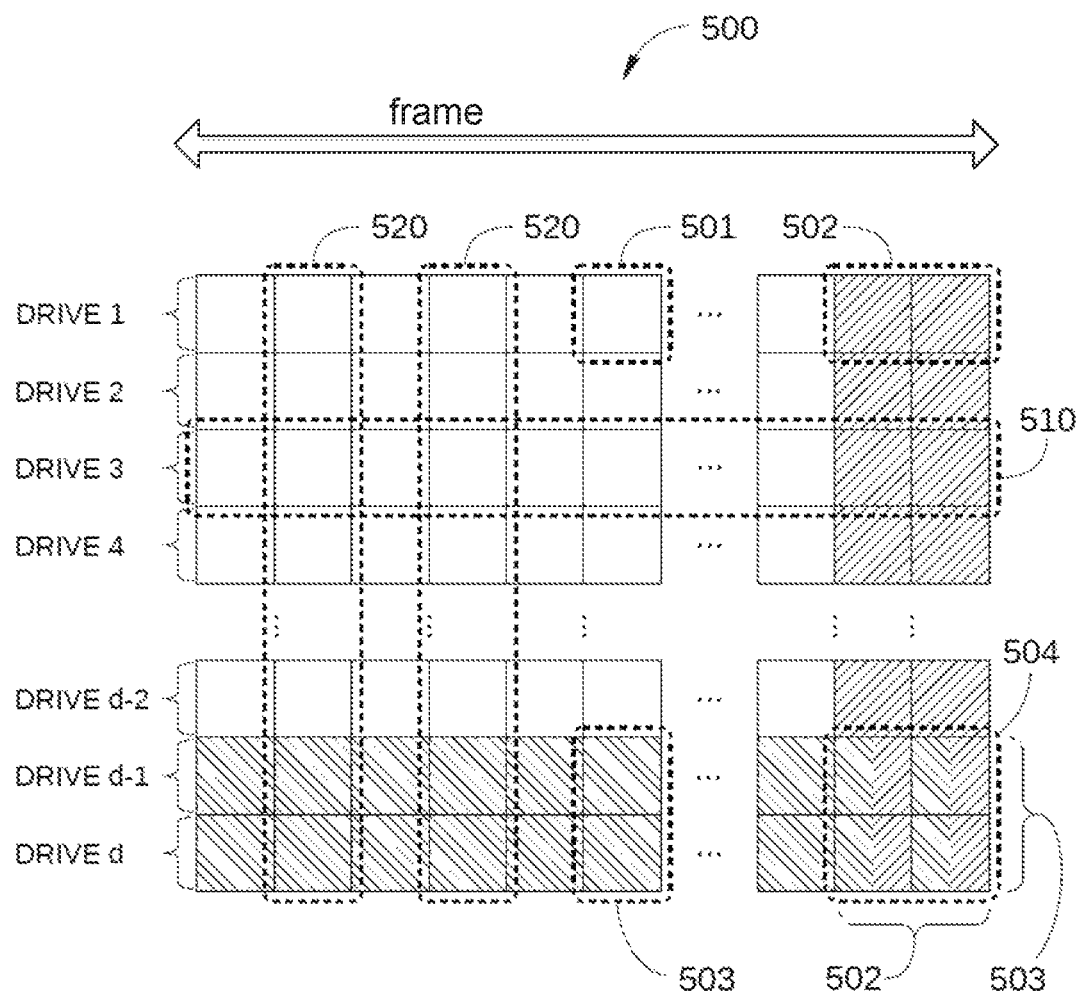
FIG. 5 schematically illustrates a single frame of the data format of FIG. 4, according to an embodiment.

FIG. 5 schematically illustrates a single frame 500 of data format 400, according to an embodiment. As shown, frame 500 spans all drives (SSDs 110) of data storage server 100 and includes a portion of each of drives 1-d of data storage server 100, where each portion includes a plurality of symbols 501. In this context, a symbol 501 is an information unit (e.g. 1 byte) of error correction for Level 1 decoding (intra-drive ECC using hard decoding), Level 2 decoding (inter-drive ECC using hard decoding), Level 3 decoding (intra-drive ECC using soft decoding), and Level 4 decoding (inter-drive ECC using soft decoding). In contrast, each frame 510 is an information unit of error correction for Level 2.5 decoding (global erasure coding using hard decoding) and Level 4.5 decoding (global erasure coding using soft decoding), and is referred to hereinafter as intra-drive ECC frame 510.

Each symbol 501 is configured for storing user data. In order to facilitate the use of a product code-based ECC scheme, some of symbols 501 are also configured to store parity data: blocks 502 and blocks 503 (product code row parity values and product code column parity values, respectively). Each of drives 1-d includes two or more blocks 502 that are configured to store intra-drive parity data, i.e., parity data configured for performing an ECC operation on that specific drive to correct or recover data that are corrupted or have been erroneously erased.

Blocks 503 are configured to store inter-drive parity data, i.e., parity data configured for performing an ECC operation and an erasure correction operation on a specific portion of each of drives 1-d to correct or recover data that are corrupted or have been erroneously erased on a corresponding portion of one of drives 1-d. An example of such an ECC operation is described in greater detail below in conjunction with FIGS. 6A-6E. Generally, two or more of drives 1-d include blocks 503 that are configured to store such inter-drive parity data, and these blocks are included in each frame 500. It is noted that in some situations, symbols 501 may include a combination of both intra-drive parity data and inter-drive parity data (e.g., blocks 504 in FIG. 5).

Symbols 501 in frame 500 are organized into a plurality of intra-drive frames ECC 510 and a plurality of inter-drive ECC frames 520. Each intra-drive ECC frame 510 includes all of the symbols 501 of a particular drive (drive 3, for example) in that particular frame 500. Thus, each intra-drive ECC frame 510 includes a row of symbols 501 in frame 500. In addition, each intra-drive ECC frame 510 includes the blocks 502 associated with that particular drive, even when blocks 502 are not disposed in the frame 500. In contrast, each inter-drive ECC frame 520 includes a single symbol 501 from each drive, where each symbol 501 corresponds to the same drive location. Thus, each inter-drive ECC frame 520 includes a column of symbols 501 in frame 500. In addition, each inter-drive ECC frame 520 includes the blocks 503 that correspond to this column of symbols 501, since these blocks 503 are configured to store parity values associated with a corresponding column of symbols 501 in frame 500.

Each intra-drive ECC frame 510 enables the implementation of an ECC operation on one or more of the symbols 501 in that particular intra-drive ECC frame 510 that are corrupted or have been erroneously erased. Generally, the ECC operation uses the parity values stored in blocks 502 of that drive as well as the remaining uncorrupted/unerased user data stored in symbols 501 to attempt correction of the corrupted or erased symbol 501. For example, in some embodiments, a binary low-density parity-check (LDPC) code, a binary BCH code, a hamming code, or a polar code may be employed.

Similarly, each inter-drive ECC frame 520 enables the implementation of an ECC operation and an erasure correction operation on one or more of the symbols 501 in that particular inter-drive ECC frame 520 that are corrupted or erroneously erased. Generally, the ECC operation and the erasure correction operation uses the parity values stored in blocks 503 of that inter-drive ECC frame 520 as well as the remaining uncorrupted/unerased user data stored in symbols 501 of the inter-drive ECC frame 520. For example, in some embodiments, a Reed-Solomon (RS) code may be employed to attempt correction of a corrupted or erased symbol 501 located in an inter-drive ECC frame 520.

FIGS. 6A-6E illustrate a cooperative ECC scheme performed with respect to a frame 600 of data storage server 100, according to an embodiment. In the embodiment described in conjunction with FIGS. 6A-6E, data storage server 100 has a total of eight SSDs 110 and frame 600 has a width of 12 symbols 501, although in practice, data storage server 100 generally includes many more than eight SSDs 110 and frame 600 has a width much greater than 12 symbols 501. Drives 7 and 8 are configured to store parity data for inter-drive ECC operations. Blocks for storing parity data for intra-drive ECC operations for each of drives 1-8 are located in a different frame than frame 600, and therefore are not shown in FIGS. 6A-6E.

Figure 6A:
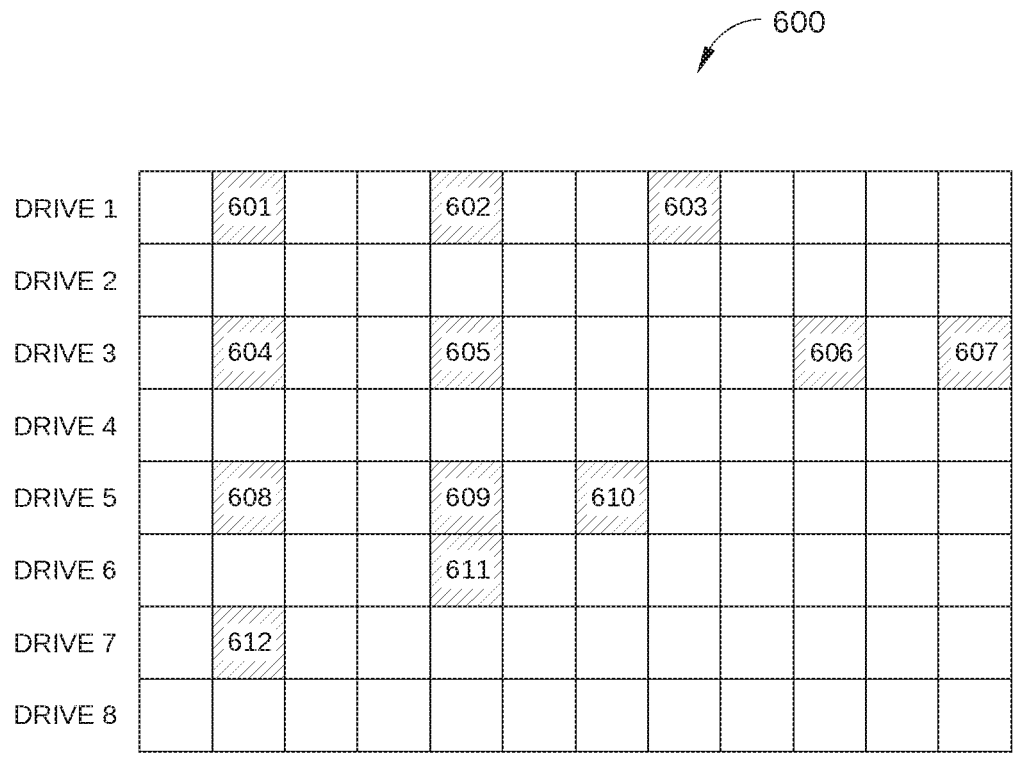
FIGS. 6A-6E illustrate a cooperative ECC scheme performed with respect to a frame of the data storage server of FIG. 1, according to an embodiment.
Figure 6B:
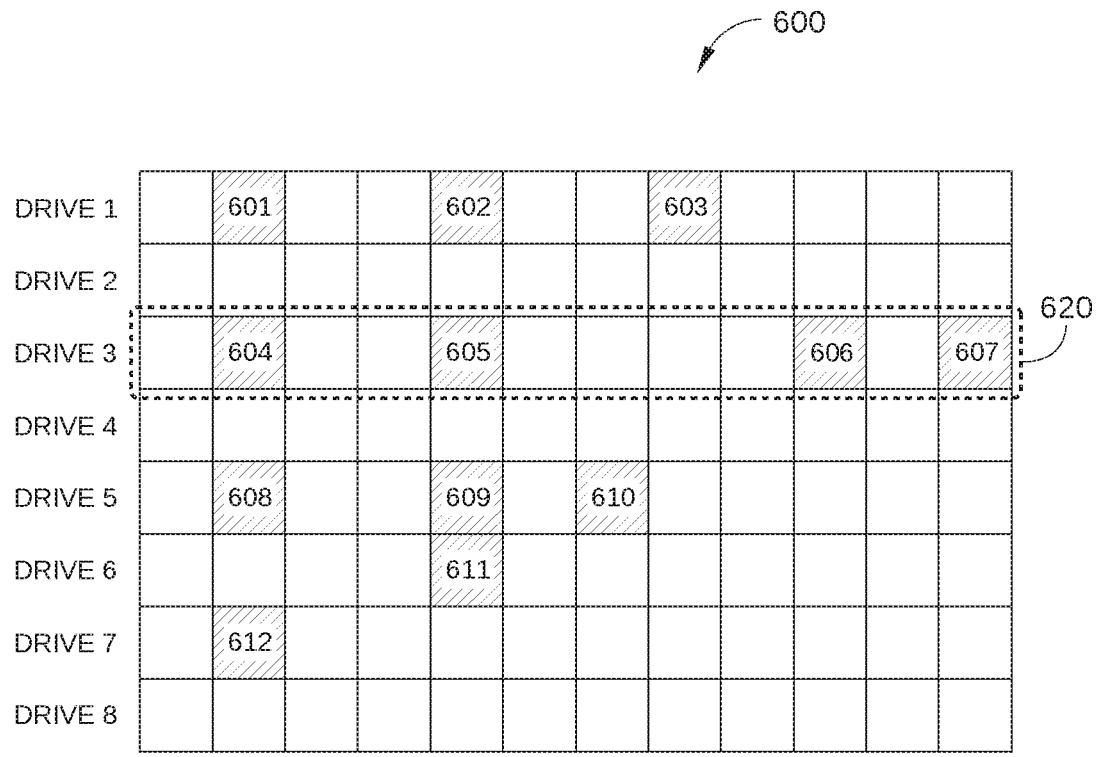

In FIG. 6A, frame 600 is shown with a number of error symbols 601-612 that are either partially or completed corrupted or have been erroneously erased. In FIG. 6B, the controller for drive 3 receives a request for data, for example from storage host 140 of data storage server 100. In this embodiment, a Read Command shown in FIG. 6F is used to issue the request where starting LBA and sector sizes of a target region 620 is addressed and a parameter "ECCCAP" is set to 1h to process only Level 1 ECC decode. Because the data are located in a target region 620 of frame 600 that is included in drive 3, the controller for drive 3 attempts to read the data stored in target region 620. Due to the presence of error bits in target region 620, the controller for drive 3 attempts Level 1 decoding, i.e., to correct errors with a hard decoding operation of the data stored in target region 620 using the intra-drive parity data for drive 3 stored in parity region 502 (not shown) and the remaining user data in target region 620. The output of a hard decoding operation is data that take on a fixed set of possible values (e.g., 0 or 1 in a binary code). For example, an LDPC or BCH decoding process may be performed by the controller of drive 3. Due to the large number of error bits included in target region 620 (i.e., error symbols 604, 605, 606, and 607 which includes error bits), the controller for drive 3 cannot successfully correct these error bits, and an uncorrectable notification is transmitted to storage host 140. In this case, the controller for drive 3 caches the uncorrectable data and its parity data in DRAM of drive 3.

Figure 6C:
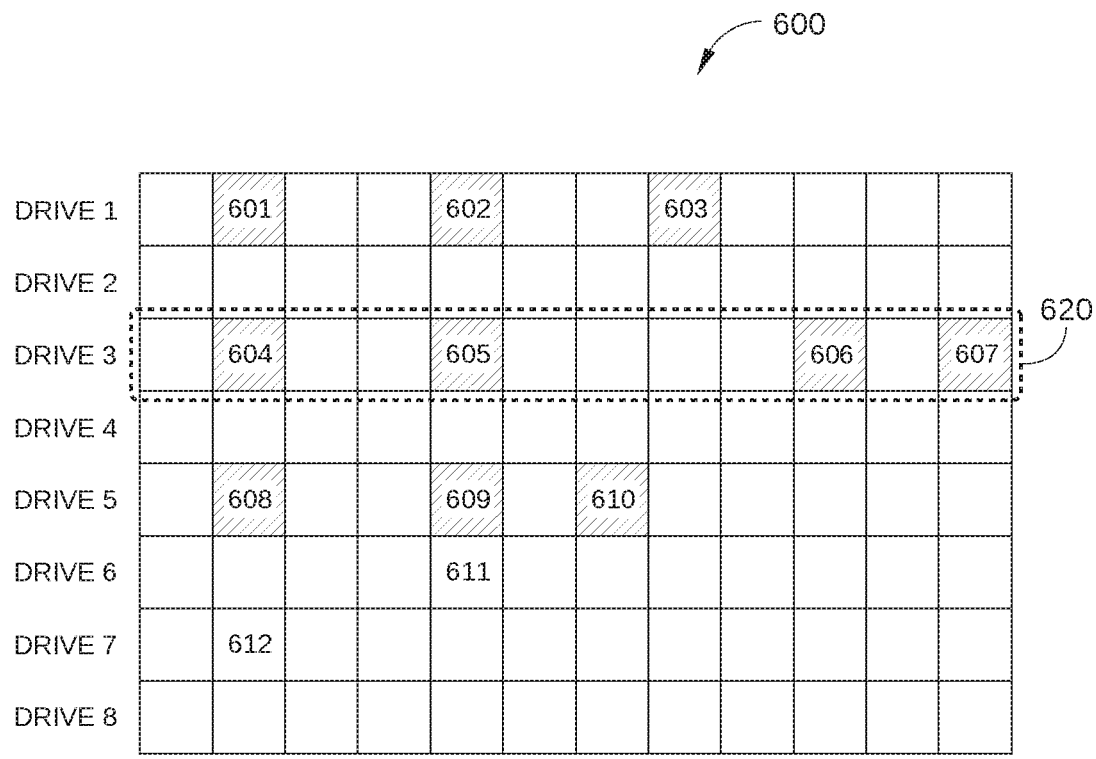

In response to the uncorrectable notification, storage host 140 initiates Level 2 decoding, i.e., a hard decoding operation using inter-drive parity data and inter-drive user data stored in frame 600. Specifically, storage host 140 requests data stored in frame 600 and its parity data from all other drives (drives 1, 2, and 4-8) by using an Extended Read Command (ECCCAP=1h) shown in FIG. 6G, and storage host 140 requests the cached uncorrectable data and its parity data from drive 3 by using an Extended Data Request Command shown in FIG. 6F, then attempts to correct or recover some or all of the error symbols in target region 620. As controller 112 for each drive (drives 1, 2, and 4-8) reads the appropriate logical regions, additional error bits may be detected, and controller 112 for the drive with detected error blocks attempts Level 1 decoding to correct these errors. In FIG. 6C, frame 600 is shown after such Level 1 decoding is successfully completed by controller 112 for drive 6 and 7, resulting in the correction or recovery of error blocks 611 and 612, respectively. However, in the case of drives 1 and 5, too many errors are present in frame 600, and these error blocks are not corrected by the above-described Level 1 decoding by the respective drive controller 112. The maximum allowable number of error bits in a target frame that can be present and still be correctable generally varies depending on how much parity data is stored in blocks 502. For example, with two symbol 502 used to store parity data for a particular drive, one or sometimes two error symbols can be corrected using Level 1 decoding.

Figure 6D:
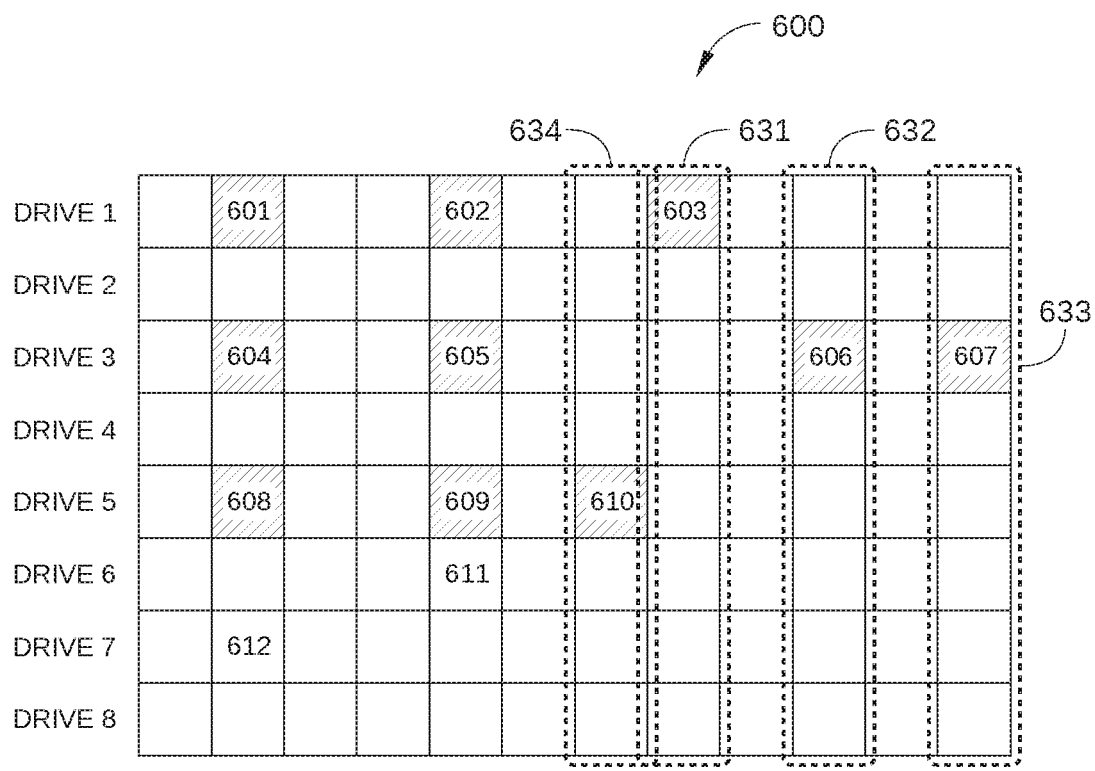

In FIG. 6D, frame 600 is shown as storage host 140 performs Level 2 decoding on the inter-drive ECC frames for which inter-drive ECC may be successful. In the example illustrated in FIG. 6D, storage host 140 performs Level 2 decoding on inter-drive ECC frames 631, 632, 633, and 634 to correct or recover error symbols 603, 606, 607, and 610, respectively. In some embodiments, a Reed-Solomon decoding operation or other linear block code decoding scheme is used to correct or recover these error symbols in frame 600 and its parity.

Figure 6E:
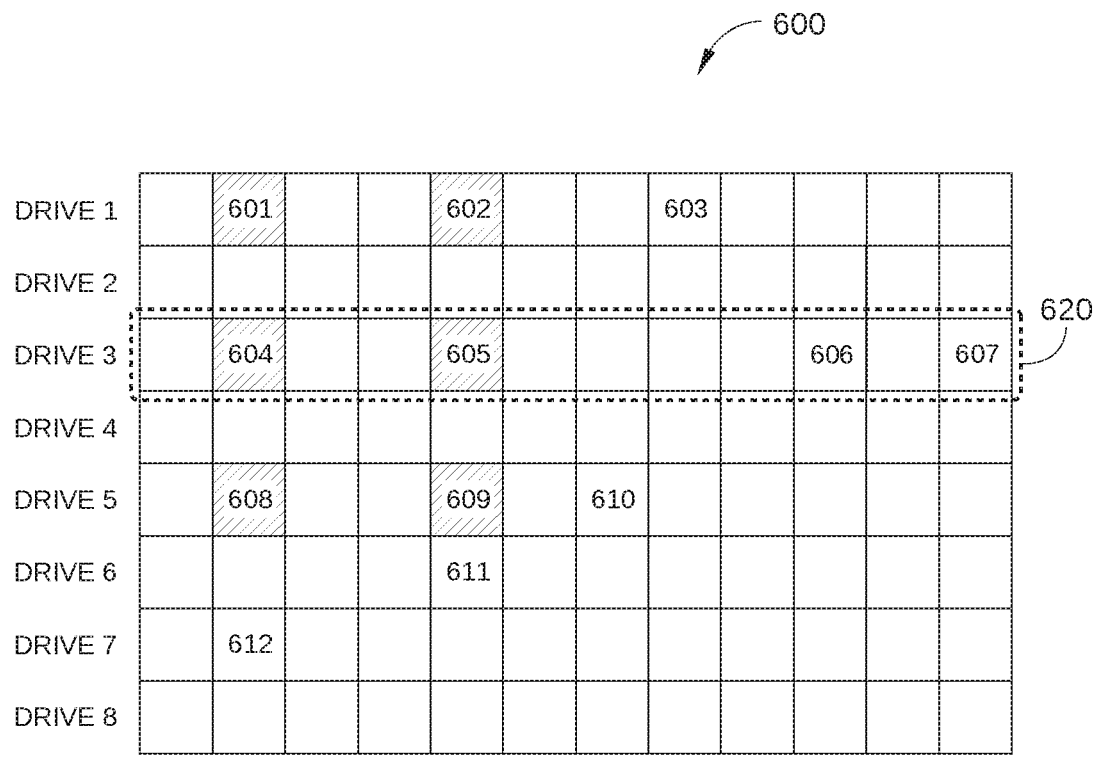

In FIG. 6E, frame 600 is shown after storage host 140 has successfully corrected or recovered error blocks 603, 606, 607, and 610 in frame 600 using Level 2 decoding. As shown, target region 620 still includes multiple error blocks (i.e., error blocks 604 and 605).

In some cases, error symbols in target region 620 may be successfully corrected by Level 2 decoding. However, in situations where the number of error blocks in target region 620 are still too numerous for Level 2 decoding to be successful, additional decoding schemes may be implemented by storage host 140 and controller 112 of drive 3. In this situation, the Level 1 decoding and the Level 2 decoding is iterated to remove the remaining error symbols in a target frame (e.g., target region 620). In such cases, storage host 140 sends an Error Correction Request Command shown in FIG. 6G to drives 1-8 and transmits the data in frame 620 in FIG. 6C and its parity data to drives 1-8. Controller 112 of drive 1-8 corrects error bits in the received data by Level 1 decoding to remove as many errors as possible from the target frame and drive 1-8 transmits the corrected data to storage host 140. If error bits still exists in the corrected data, then storage host 140 initiates Level 2 decoding (described above) to further remove errors from the target frame and these processes are iterated. Thus the iterations of Level 1 decoding and Level 2 decoding are processed. If errors remain in the target frame, storage host 140 may perform an iteration check to determine if a maximum threshold number of iterations of hard decoding has been performed. If not, storage host 140 passes control of the error recovery process back to the controller of the drive, and the above process may be repeated until the maximum threshold number of hard decoding iterations is exceeded or until the errors are removed.

In some embodiments, storage host 140 can initiate Level 2.5 decoding (using global parity data 410) to further remove errors from the target frame.

In some cases, error symbols in target region 620 may be successfully corrected by the iteration of Level 1 decoding and Level 2 decoding and Level 2.5 decoding. However, in situations where error bits still exist in target region 620, additional decoding schemes may be implemented by storage host 140 and controller 112 of drive 3. For example, controller 112 of drive 3 can perform soft decoding of error blocks in target region 620, i.e., employ a soft-decision decoder algorithm to decode data. In this embodiment, a Read Command shown in FIG. 6F is used to issue the request where starting LBA and sector sizes of a target region 620 is addressed and a parameter "ECCCAP" is set to 2h to process only Level 3 ECC decode. The inputs to a soft-decision decoder may take on a wide range of values (soft data) rather than just a few fixed values (hard data). This extra information indicates the reliability of each input data point, and is used to form better estimates of the original data. Therefore, the soft-decision decoder algorithm of Level 3 decoding will typically perform better in the presence of corrupted data than the hard-decision decoder algorithm of Level 1 decoding. However, soft decoding algorithms are generally more complex than hard decoding algorithms, and may significantly results in worse latency in data storage server 100.

In some embodiments, when soft decoding of target region 620 fails to correct sufficient error blocks therein so that Level 2 decoding can successfully remove the remaining error blocks in target region 620, storage host 140 can also perform soft decoding operations. For example, storage host 140 requests soft decode data from the remaining drives for frame 600 to perform additional inter-drive ECC operations based on this Level 3 decoding soft decode data. In this case, storage host 140 sends Extended Read Commands (ECCCAP=2h) shown in FIG. 6G to drive 1, 2, and 4-8 and sends Extended Data Request Command (ECCCAP=2h) to drive 3. In such embodiments, storage host 140 may perform Level 4 decoding (inter-drive ECC using soft decoding) using such Level 3 decoding soft decode data even when the Level 3 decoding operation fails to completely correct some or all of the error blocks in an intra-drive ECC frame.

In some cases, error symbols in target region 620 may be successfully corrected by Level 4 decoding. However, in situations where the number of error blocks in target region 620 are still too numerous for Level 4 decoding to be successful, additional decoding schemes may be implemented by storage host 140 and controller 112 of drive 3. In this situation, the Level 3 decoding and the Level 4 decoding is iterated to remove the remaining error symbols in a target frame (e.g., target region 620). In such cases, storage host 140 sends Error Correction Request Commands (ECCCAP=2h) shown in FIG. 6G to drives 1-8 and transmits the data in frame 620 in FIG. 6C and its parity data to drives 1-8. Controller 112 of drive 1-8 corrects error bits in the received data by Level 3 decoding to remove as many errors as possible from the target frame and drive 3 transmits the corrected data to storage host 140. If error bits still exists in the corrected data, then storage host 140 initiates Level 4 decoding (described above) to further remove errors from the target frame and these processes are iterated. Thus the iterations of Level 3 decoding and Level 4 decoding are processed. If errors remain in the target frame, storage host 140 may perform an iteration check to determine if a maximum threshold number of iterations of hard decoding has been performed. If not, storage host 140 passes control of the error recovery process back to the controller of the drive, and the above process may be repeated until the maximum threshold number of hard decoding iterations is exceeded or until the errors are removed.

In some embodiments, storage host 140 uses global erasure code and global parity data (such as global parity data 410, shown in FIG. 4) to correct or recover erased blocks in target region 620 that are otherwise unrecoverable. Thus, in some embodiments, storage host 140 performs Level 2.5 decoding (global error correction using hard decoding) and/or Level 4.5 decoding (global error correction using soft decoding).

For example, an iteration of Level 2.5 decoding using global parity data 410 may be employed after an iteration of Level 1 decoding and Level 2 decoding have been attempted and have failed to remove the remaining error blocks in a target frame (e.g., target region 620). In such cases, the controller for the drive corresponding to the target frame attempts Level 1 decoding (described above) on the drive to remove as many errors as possible from the target frame, storage host 140 initiates Level 2 decoding (described above) to further remove errors from the target frame and these processes are iterated. Then, storage host 140 initiates Level 2.5 decoding (using global parity data 410) to further remove errors from the target frame. If errors remain in the target frame, storage host 140 may perform an iteration check to determine if a maximum threshold number of iterations of hard decoding has been performed. If not, storage host 140 passes control of the error recovery process back to the controller of the drive, and the above process may be repeated until the maximum threshold number of hard decoding iterations is exceeded or until the errors are removed.

In some embodiments, after a maximum threshold number of hard decoding iterations is exceeded, one or more iterations of soft decoding that include Level 4.5 decoding (soft decoding of global parity data) may be performed. In such embodiments, Level 4.5 decoding using global parity data 410 may be employed after an iteration of Level 3 soft decoding and Level 4 soft decoding have been attempted and have failed to remove the remaining error blocks in a target frame. In such cases, the controller for the drive corresponding to the target frame attempts Level 3 decoding (described above) on the drive to remove as many errors as possible from the target frame, storage host 140 initiates Level 4 decoding (described above) to further remove errors from the target frame and these processes are iterated. Then, storage host 140 initiates Level 4.5 decoding (using global parity data 410) to further remove errors from the target frame. If errors remain in the target frame, storage host 140 may perform an iteration check to determine if a maximum threshold number of iterations of soft decoding has been performed. If not, storage host 140 passes control of the error recovery process back to the controller of the drive, and the above process may be repeated until the maximum threshold number of soft decoding iterations is exceeded or the errors are removed.

Figure 7:
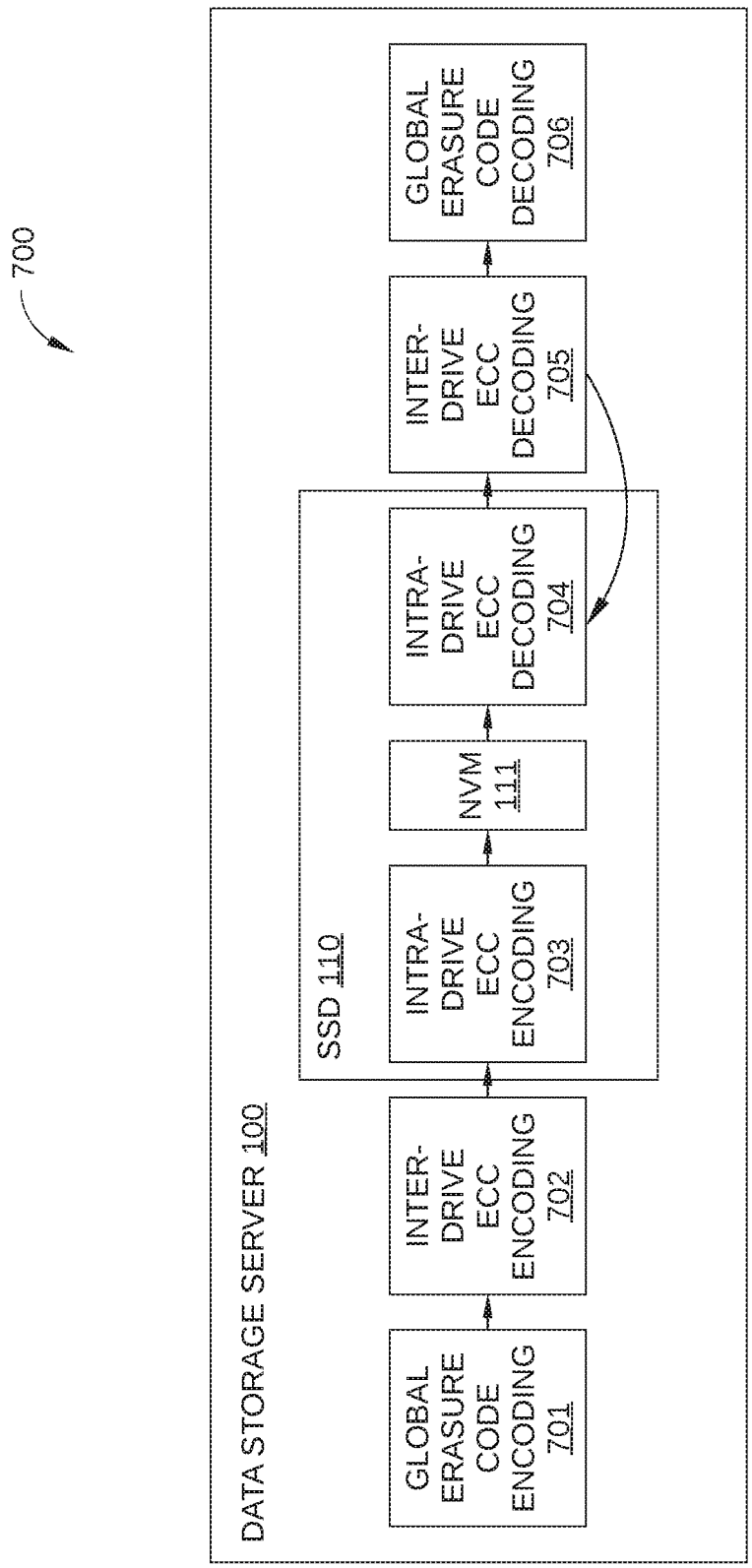
FIG. 7 is a block diagram illustrating a data path for data that are stored in and then retrieved from the data storage server of FIG. 1.

FIG. 7 is a block diagram illustrating a data path 700 for data that are stored in and then retrieved from data storage server 100. Data path 700 includes a series of operations performed on such data: global erasure code encoding 701, inter-drive ECC encoding 702, intra-drive ECC encoding 703, intra-drive ECC decoding 704, inter-drive ECC decoding 705, and global erasure decoding 706. In addition, the physical location at which each of the above operations are performed is graphically represented is FIG. 7, i.e., data storage server 100, SSD 110, and non-volatile memory 111.

Global erasure code encoding 701 is performed by storage host 140, and includes the generation of global parity data (such as global parity data 410, shown in FIG. 4) that are then stored in one or more frames of data storage server 100. Inter-drive ECC encoding 702 is performed by storage host 140, and includes the generation of inter-drive parity data, such as that stored in blocks 503 in FIG. 5. Intra-drive ECC encoding 703 is performed by controller 112 of the SSD 110 in which the data are to be stored, and includes the generation of intra-drive parity data, such as that stored in blocks 502 in FIG. 5. Upon completion of global erasure code encoding 701, inter-drive ECC encoding 702, and intra-drive ECC encoding 703, the data are stored in non-volatile memory 111 in one or more frames, such as frames 500 in FIG. 5.

When the data (hereinafter referred to as the "target data") are to be retrieved from non-volatile memory 111 and one or more errors are detected, intra-drive ECC decoding 704 is performed by controller 112 of the SSD 110 in which the target data are stored. If intra-drive ECC decoding 704 is unsuccessful, inter-drive ECC decoding 705 is then performed by storage host 140 using parity and user data retrieved from the other SSDs 110 of data storage server 100. If inter-drive ECC decoding 705 is unsuccessful, corrected data by inter-drive ECC decoding 705 is transmitted to the SSD 110 and intra-drive ECC decoding 704 may be performed again by controller 112 of the SSD 110. In this embodiment, the intra-drive ECC decoding 704 is performed by controller 112 of the SSD 110 in which the target data are stored, but, in some embodiment, the intra-drive ECC decoding 704 after first iteration may be performed by controller 112 of a SSD in which the target data are not stored. Alternatively, global erasure decoding 706 may be performed by storage host 140 on the target data.

FIGS. 8A-8D set forth a flowchart of method steps for error correction in a data storage device that includes a plurality of data storage drives and a storage host with a processor configured to receive error-corrected data from each of the data storage drives, according to some embodiments. Although the method steps are described in conjunction with data storage server 100 of FIG. 1, persons skilled in the art will understand that the method in FIGS. 8A-8D may also be performed with other types of computing systems.

Figure 8A:
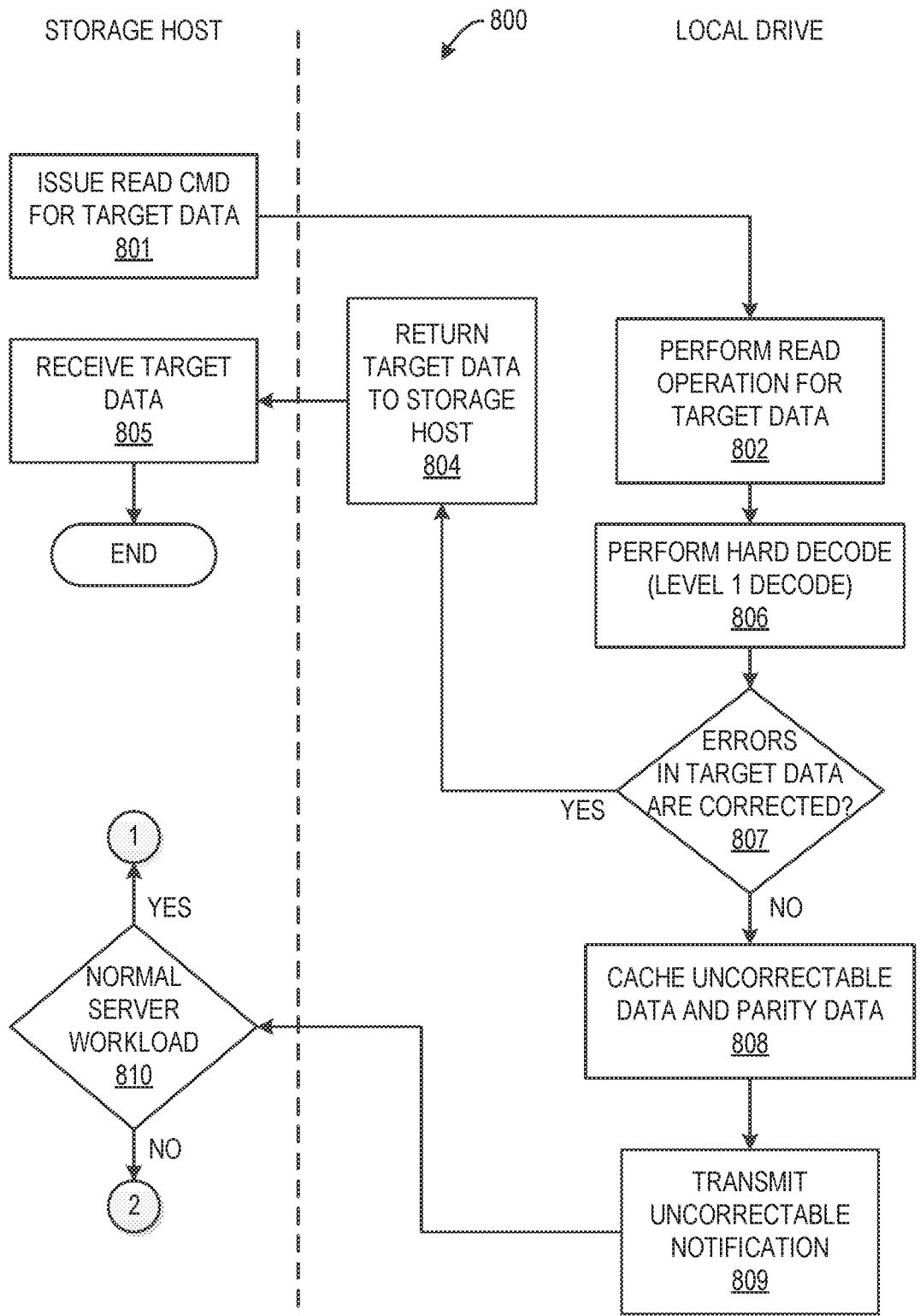
FIGS. 8A-8D set forth a flowchart of method steps for error correction in a data storage device that includes a plurality of data storage drives and a storage host with a processor configured to receive error-corrected data from each of the data storage drives, according to some embodiments.
Figure 8B:
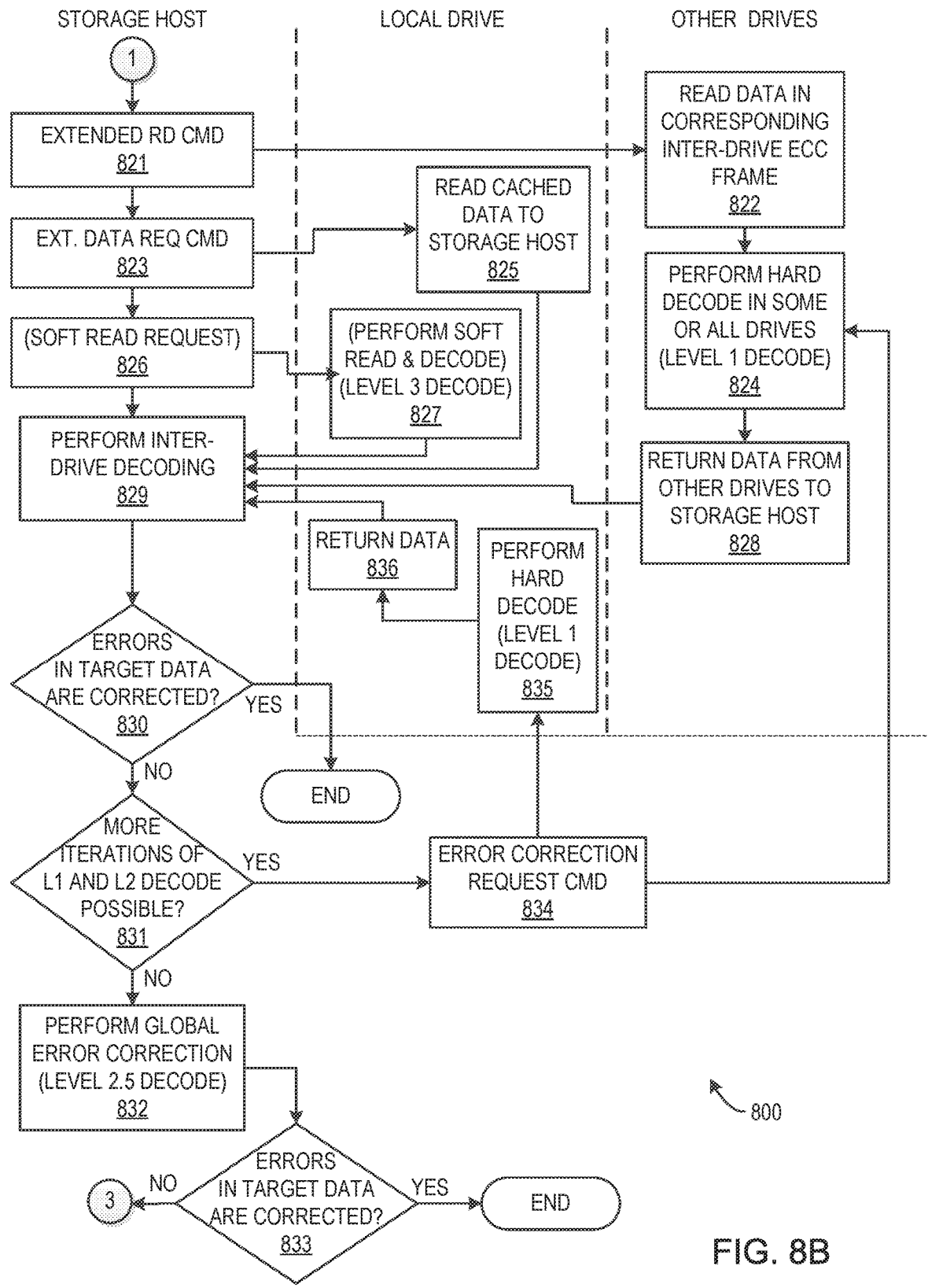
Figure 8C:
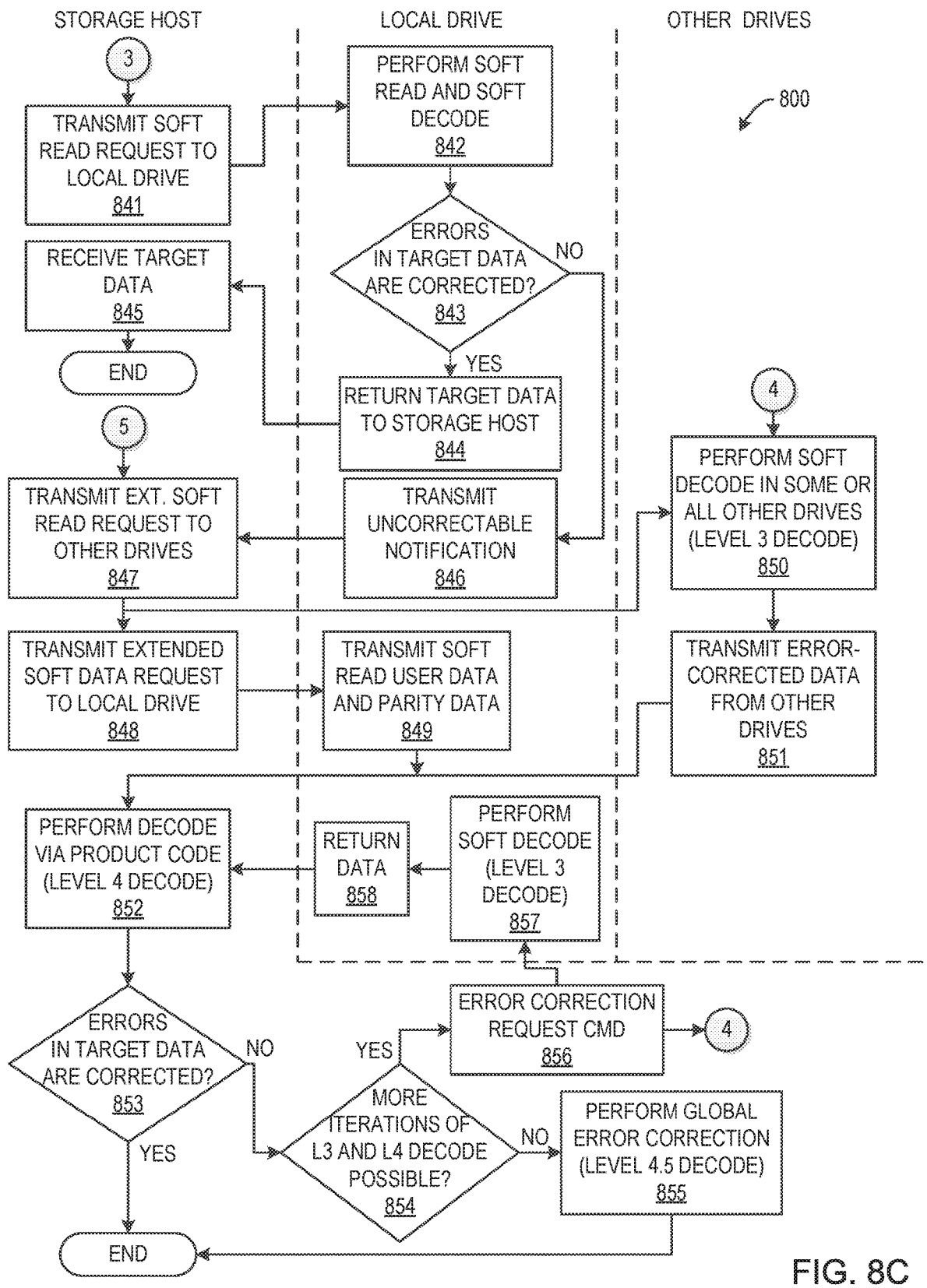
Figure 8D:
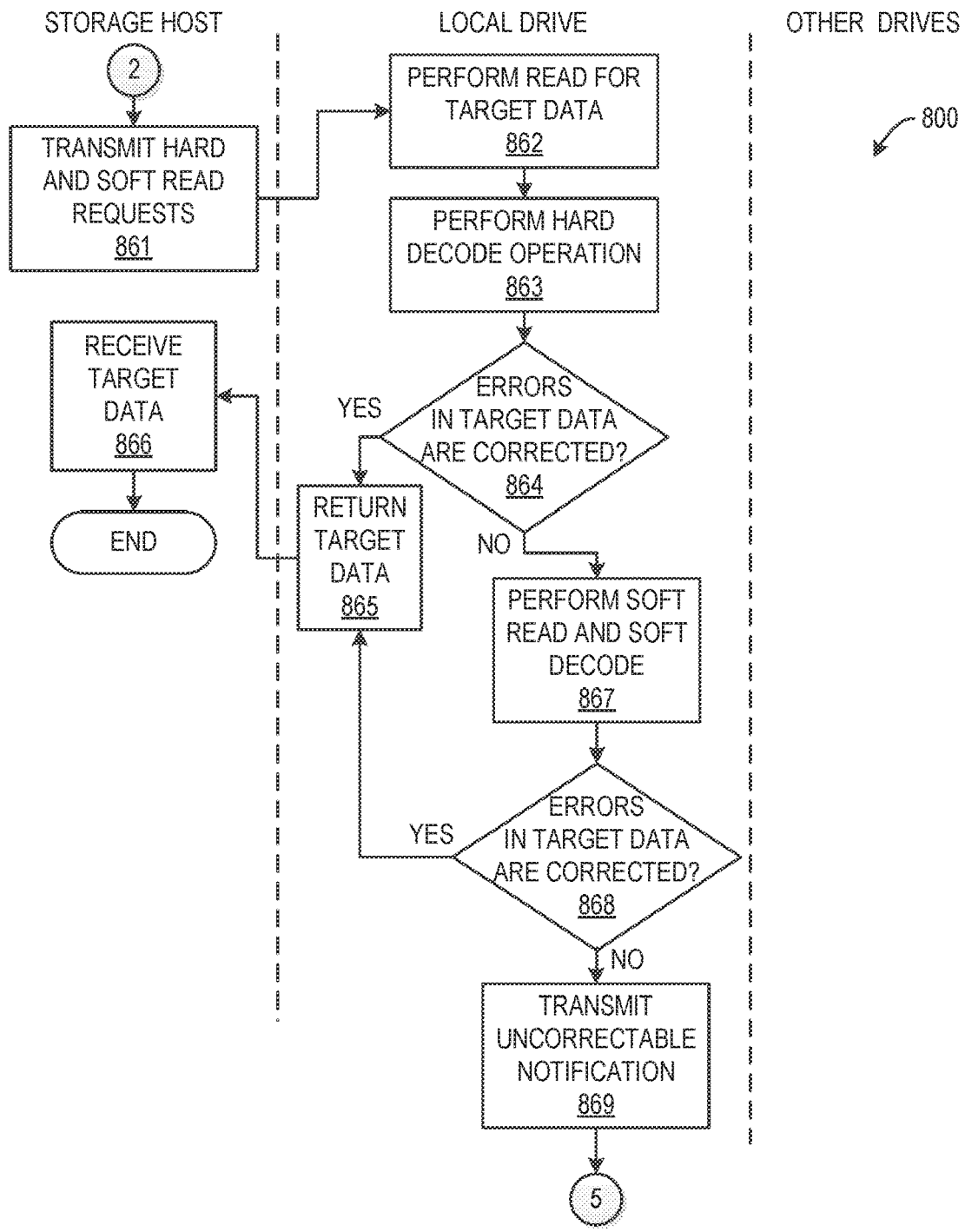

Method 800 begins at step 801 shown in FIG. 8A, where storage host 140 issues a read command (ECCCAP=1h) shown in FIG. 6F for target data stored in a particular SSD 110 of data storage server 100 (hereinafter referred to as the "local drive"). In step 802, the local drive performs a read operation from non-volatile memory 111 for the target data. In step 806, the local drive performs a hard decode operation (i.e., Level 1 decoding), as described above in conjunction with FIG. 6B. In step 807, the local drive determines whether there are any uncorrectable errors in the target data. For example Cyclic Redundancy Check (CRC), a checksum or other operation may be performed to make such a determination. If uncorrectable errors are not detected, method 800 proceeds to step 804. If uncorrectable errors are detected, method 800 proceeds to step 808. In step 804, the local drive returns the corrected target data to storage host 140, which receives the target data in step 805 and method 800 ends.

In step 808, the local drive caches the uncorrectable data and parity data of the uncorrectable data in the DRAM of the local drive. In step 809, the local drive transmits an uncorrectable notification to storage host 140. In step 810, storage host 140 determines the current workload of data storage server 100. If the current workload is normal, for example, the current workload is determined to be less than a predetermined threshold, method 800 proceeds to step 821 in FIG. 8B. If the current workload is high, for example the current workload is determined to be greater than a predetermined threshold, method 800 proceeds to step 861 in FIG. 8D. Thus, storage host 140 selects a different error correction scheme depending on the current workload of data storage server 100. When data storage server 100 is busy, storage host 140 can select an error correction scheme that is performed by the local drive rather than by storage host 140.

In step 821 (see FIG. 8B), in response to the workload of data storage server 100 being determined to be normal, storage host 140 transmits an extended read command (FIG. 6G, ECCCAP=1h) to the remaining drives of data storage server 100. The extended read command includes a read request for user data and its parity data stored in the remaining drives. Specifically, this read request is for data that corresponds to the one or more error blocks detected in the target data in step 807. Thus, in response to this extended read command, the remaining drives perform a read operation in step 822 to read the blocks that correspond to the one or more inter-drive ECC frames that correspond to these error blocks, and the parity data associated with these inter-drive ECC frames, so that storage host 140 can subsequently perform Level 2 decoding on one or more target inter-drive ECC frames. In step 823, storage host 140 also transmits an extended data request command (FIG. 6F, ECCCAP=1h) to the local drive. The extended data request command includes a read request for the uncorrectable data and its parity data that were cached in the local drive in step 808.

In step 824, each of the remaining drives of data storage server 100 performs Level 1 decoding in an attempt to correct error bits in data which is read in step 822. In step 825, the local drive returns the uncorrectable data and its parity data that were cached in the local drive in step 808 to storage host 140. In another embodiment, the local drive may return partially-corrected data and its parity data to storage host 140 in step 825. In step 828, each of the remaining drives returns the requested data and its parity data to storage host 140. It is noted that in the case of some or all of the drives, the data sent may be completely corrected or incompletely corrected. Because even partially corrected data can improve the effectiveness of subsequent error correction operations, the data read in step 822 is sent to storage host 140 in step 828 regardless of whether all errors have been completely corrected.

In optional step 826, storage host 140 transmits a soft read request (read command (ECCCAP=2h) in FIG. 6F) to the local drive. For example, when the errors detected in the target data in step 803 are determined to be extensive, storage host 140 can initiate soft decoding (i.e., Level 3 decoding) in the local drive in parallel with other error correction operations. In optional step 827, the local node performs soft read and soft decode operations (Level 3 decoding) in the background, while data for inter-drive ECC operations is being retrieved from the remaining drives.

In step 829, storage host 140 performs inter-drive decoding of the target data using the user data and parity data received from the remaining drives in step 828 and from the local drive in step 825 (and in optional step 827). For example, storage host 140 may perform inter-drive ECC of one or more inter-drive ECC frames via a product code-based ECC scheme as described above in conjunction with FIG. 6D. In step 830, storage host 140 determines if the detected errors in the target data are corrected. If the errors are corrected, method 800 ends. If the errors are not corrected, method 800 proceeds to step 831.

In step 831, storage host 140 determines if additional iterations of are possible. For example, some error blocks in the target frame may be corrected by Level 2 decoding in step 829, but there may still be too many error blocks in the target frame to allow error correction of the target frame with Level 1 decoding (intra-drive ECC) in the local drive. In this instance, storage host 140 may determine that an additional iteration of Level 1 decoding in the remaining drives may allow further error correction of the target data. If storage host 140 determines that additional iterations of Level 1 and Level 2 are possible, storage host 140 sends an Error Correction Request Command (ECCCAP=1h) in FIG. 6G (step 834) and transmits partially corrected data by the Level 2 decoding performed in step 829 to the local drive (step 835) and to the remaining drives (step 824). The local drive performs Level 1 decoding in step 835 and returns the data and its parity data to storage host 140 in step 836, and method 800 continues thereafter from step 829. If storage host 140 instead determines that additional iterations of Level 2 decoding are not possible (for example when no error blocks are corrected in step 830 or iteration counts exceeds a limit), method 800 proceeds to step 832.

In step 832, storage host 140 performs global error correction (i.e., Level 2.5 decoding) using soft decoding of global parity data stored in data storage server 100. In step 833, storage host 140 determines if the detected errors in the target data are corrected. If the errors are corrected, method 800 ends. If the errors are not corrected, method 800 proceeds to step 841 in FIG. 8C.

In step 841 (see FIG. 8C), in response to Level 2 and Level 2.5 decoding failing to correct the errors in the target data, storage host 140 transmits a soft read request (read command (ECCCAP=2h) in FIG. 6F) to the local drive (unless the optional soft read request of step 826 has already been performed). In step 842, the local drive performs soft read and soft decode operations on error blocks associated with the target data. In step 843, the local drive determines whether the errors in the target data are corrected. If the errors are corrected, method 800 proceeds to step 844. In step 844, the local drive returns the target data to storage host 140, which receives the target data in step 845 and method 800 ends. If errors are not corrected, method 800 proceeds to step 846. In step 846, the local drive transmits an uncorrectable notification to storage host 140.

In response to Level 3 decoding failing to correct the errors in the target data, in step 847 storage host 140 transmits an extended soft read request (Extended Read Command in FIG. 6G, ECCCAP=2h) to the remaining drives and in step 848 storage host 140 transmits an extended soft data request (Extended Data Request Command in FIG. 6F, ECCCAP=2h) to the local drive. In step 849, the local drive transmits to storage server 140 the soft read user data and soft parity data read in step 842. In step 850, one or more of the remaining drives each perform soft decode operations (Level 3 decoding) to correct any as yet uncorrected error blocks, and in step 851 these drives transmit any error-corrected data to storage host 140 for use in Level 4 decoding.

In step 852, storage host 140 performs inter-drive decoding (Level 4 decoding) of the target data using the soft decoded user data and parity data received from the remaining drives in step 825. For example, storage host 140 may perform inter-drive ECC of one or more inter-drive ECC frames via a product code-based ECC scheme as described above in conjunction with FIG. 6D. In step 853, storage host 140 determines if the detected errors in the target data are corrected. If the errors are corrected, method 800 ends. If the errors are not corrected, method 800 proceeds to step 854.

In step 854, storage host 140 determines if additional iterations of Level 3 and Level 4 of are possible. For example, some error blocks in the target frame may be corrected by Level 4 decoding in step 852, but there may still be too many error blocks in the target frame to allow error correction of the target frame with Level 3 decoding (intra-drive ECC) in the local drive. In this instance, storage host 140 may determine that an additional iteration of Level 3 and 4 decoding in the remaining drives may allow further error correction of the target data. If storage host 140 determines that additional iteration of Level 3 and Level 4 are possible, storage host 140 sends Error Correction Request Command (ECCCAP=3h) (step 856), and transmits partially corrected soft data by the Level 4 decoding performed in step 852 to the local drive (step 857) and to the remaining drives (step 850). The local drive performs Level 3 decoding in step 857 and returns the data and its parity data to storage host 140 in step 858, and method 800 continues thereafter from step 852. If storage host 140 instead determines that additional iterations of Level 3 and Level 4 decoding are not possible (for example when no error blocks are corrected in step 850 or iteration counts exceeds a limit), method 800 proceeds to step 855. In step 855, storage host 140 performs global error correction (i.e., Level 4.5 decoding) using soft decoding of global parity data stored in data storage server 100, and method 800 ends.

In step 861 (see FIG. 8D), in response to the workload of data storage server 100 being determined to be high in step 810 (see FIG. 8A), storage host 140 transmits a hard and soft read request (Read Command in FIG. 6F, ECCCAP=3h) to the local drive. Thus, when storage host 140 determines that the workload of data storage server 100 is high, additional error correction operations are transferred to the local drive (i.e., soft reading and decoding), so that computational resources of data storage server 100 are not required. Method 800 then proceeds to step 862. In step 862, the local drive performs a read operation from non-volatile memory 111 for the target data. In step 863, the local drive performs a hard decode operation (i.e., Level 1 decoding), as described above in conjunction with FIG. 6B. In step 864, the local drive determines whether there are any uncorrectable errors in the target data. If uncorrectable errors are not detected, method 800 proceeds to step 865. If uncorrectable errors are detected, method 800 proceeds to step 867. In step 867, the local drive performs soft read and soft decode operations on error blocks associated with the target data. In step 868, the local drive determines whether the errors in the target data are corrected. If the errors are corrected, method 800 proceeds to step 865. In step 865, the local drive returns the target data to storage host 140, which receives the target data in step 866 and method 800 ends. If errors are not corrected, method 800 proceeds to step 869. In step 869, the local drive transmits an uncorrectable notification to storage host 140, and method proceeds to step 847 of FIG. 8C.

Method 800 enables latency associated with error correction in a data storage server to be controlled through cooperative error correction that is performed by both the local drive associated with errors and a storage host of the data storage server. For example, when errors are detected, the storage host can select an error correction scheme based on the current workload of the data storage server, so that the high latency associated with an overloaded data storage server is avoided. In addition, because more complex ECC algorithms (i.e., inter-drive ECC operations) are performed by the storage host, the complexity of the SSD controllers in the data storage server is not increased.

Second Embodiment

Figure 9:
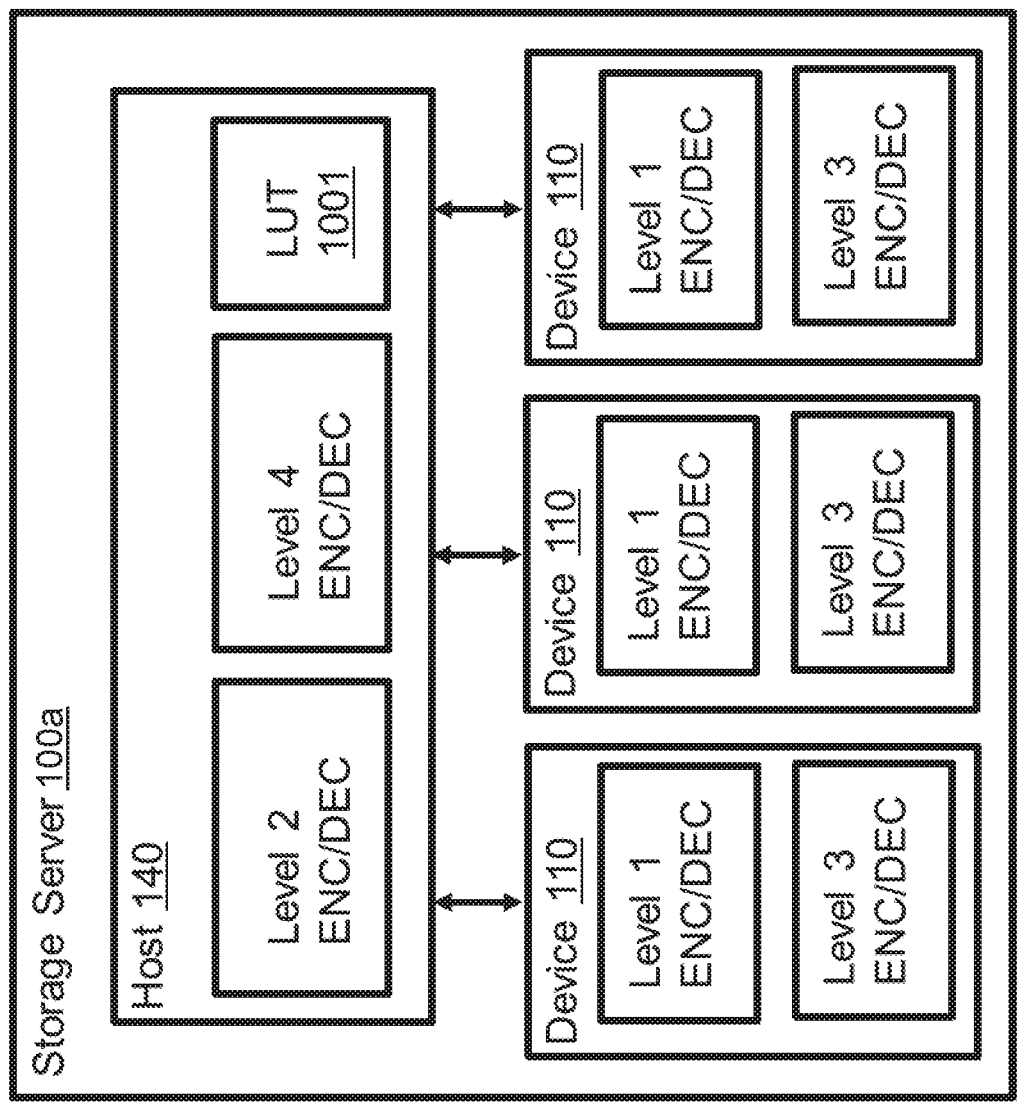
FIG. 9 schematically illustrates a data storage server, configured according to a second embodiment.

FIG. 9 schematically illustrates a data storage server 100*a* according to a second embodiment. The same ECC encoding/decoding schemes are employed in data storage server 100*a* as in data storage sever 100 according to the first embodiment. That is, similarly to the first embodiment, Read Command, Extended Data Request Command, Extended Read Command, and Error Correction Request Command are employed to implement the ECC decoding schemes.

Data storage server 100*a* of the present embodiment is different from data storage sever 100 in that mapping between an ID of data and physical location (physical address) in SSD 110 is stored in a look-up table (LUT) 1001 (or index data) in a memory unit of storage host 140, while data storage server 100 of the first embodiment includes a table indicating mapping between logical address and physical location in SSD 110 in each of SSD 110. That is, the mapping is managed by storage host 140, not by SSDs 110, in the present embodiment. When storage host 140 sends Read Command, Extended Data Request Command, Extended Read Command, and Error Correction Request Command to SSD 110, each of the commands includes physical address of SSD 110 from which data are to be read and a size of the data, instead of logical block address of data to be read (LBA in FIGS. 6F and 6G) and the transfer length of the data to be read (Transfer length in FIGS. 6F and 6G) employed in the first embodiment.

During an operation to read data from SSD 110, the intra-drive ECC operation by SSDs 110 and the inter-drive ECC operation by storage host 140 are carried out in accordance with the flowcharts shown in FIGS. 8A-8D. Storage host 140 designates the physical location and the size of data to be read in the commands (Read Command, Extended Data Request Command, Extended Read Command, and Error Correction Request Command).

Figure 10:
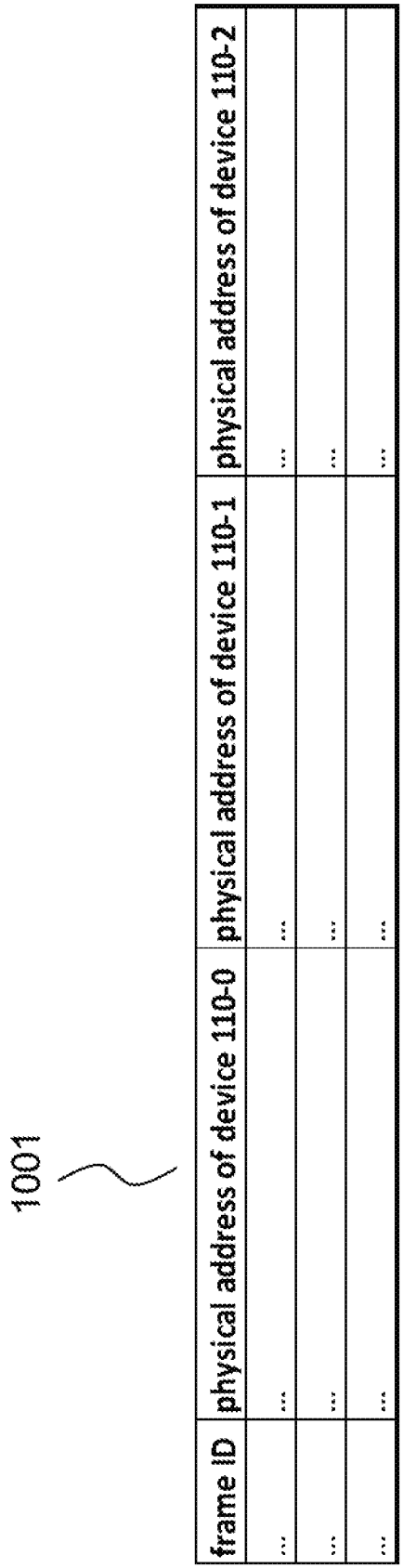
FIG. 10 schematically illustrates a data format of a look-up table (LUT) stored in storage host of the data storage server according to the second embodiment.

Host 140 refers to LUT 1001 in order to specify the physical location of SSD 110. FIG. 10 schematically illustrates a data format of LUT 1001 stored in storage host 140. LUT 1001 indicates, in each entry, correspondence between a frame ID and physical locations of each SSD 110 in data storage server 100*a*. The physical locations corresponding to the frame ID are dynamically updated in accordance with operation of data storage sever 100*a*. When a frame ID corresponding to data to be read (read data) is known, storage host 140 can specify the corresponding physical location of a target SSD 110, and sends a command designating the specified physical location to the target SSD 110.

For example, when Level 1 or Level 3 decoding is carried out on data stored in (cached from) the SSD 110, storage host 140 sends a Read Command (Extended Data Request Command) to SSD (local drive) 100 from which the data are to be read. Before Level 2 or Level 4 decoding is carried out on data stored in the local drive, storage host 140 sends an Extended Read Request Command or an Error Correction Request Command to SSDs 110 other than the local drive, in order to receive data stored in the SSDs 110.

During an operation to write data into SSD 110, a physical location of SSD 110 for storing data to be written (write data) may be determined by either host 140 or SSD 110. When storage host 140 designates the physical location, storage host 140 may include information about the physical location in a Write Command sent from storage host 140 to one of SSDs 110 (the target SSD). For example, when the write data are a particular type of data that should be written into a particular physical location (e.g., system data), storage host 140 may designate the physical location. When the target SSD determines the physical location, the Write Command includes no information about the physical location, and a return notification, which is sent from the target SSD to storage host 140 in response to the Write Command (or upon completion of the data writing) may include the physical location, such that storage host 140 can manage mapping between the ID of the written data and the physical location.

Figure 11:
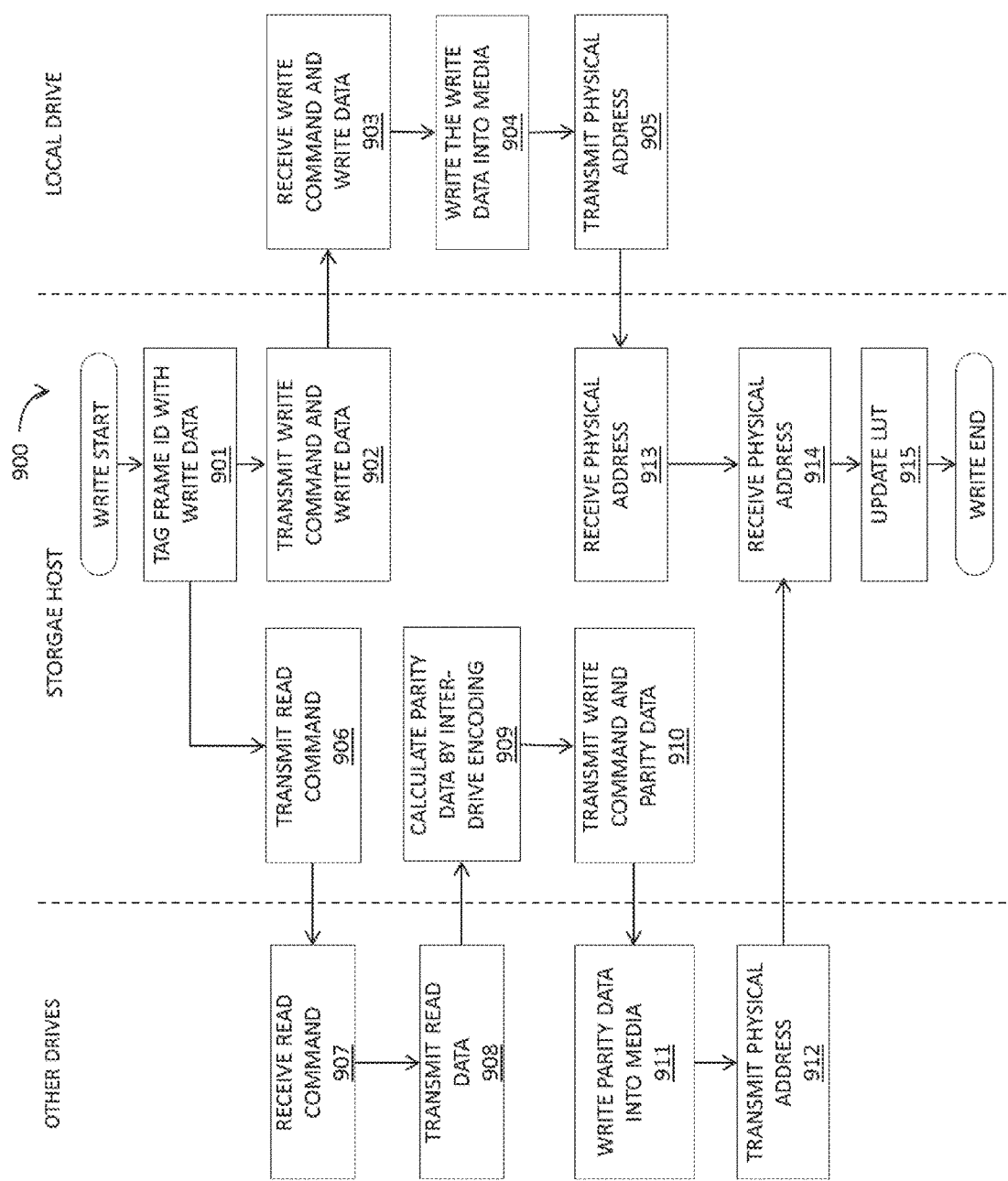
FIG. 11 sets forth a flowchart of method steps for a data writing operation carried out in the data storage server according to the second embodiment.

FIG. 11 sets forth a flowchart of method steps for a data writing operation in a data storage device that includes a plurality of data storage drives and a storage host according to the present embodiment. Method 900 begins at step 901 shown in FIG. 11, where storage host 140 tags (associates) data to be written (write data) with a frame ID in LUT 1001. In step 902, storage host 140 transmits a Write Command, a size of the write data, and the write data, to an SSD 110 (hereinafter, a local drive), through one or more data transmissions. The local drive receives the Write Command, the size of the write data, and the write data in step 903, and then writes the write data into a physical location of the local drive, which is determined according to a predetermined algorithm by the local drive in step 904. At this step, parity data of the write data are also calculated through an intra-drive encoding (Level 1 and/or Level 3 encoding) based on the write data and other user data stored in the local drive. After the write data have been written into the physical location, the local drive transmits the physical location to the storage host 140.

In parallel to the operation to write data into the local drive, storage host 140 calculates parity data of the write data. This calculation of the parity data starts at step 906, where storage host 140 transmits a read command to other SSDs (other drives) 110 that store user data (e.g., Drives 1 through d−2 in FIG. 5), along with a physical location corresponding to the frame ID tagged in step 901, by referring to LUT 1001. In step 907, each of the other drives 110 receives the read command with the physical location, and reads data stored in the physical location. Here, intra-drive error decoding may be performed on each of the read data. Then, in step 908, each of the other drives 110 transmits read data to storage host 140. Upon receiving the read data, in step 909, storage host 140 calculates parity data through the inter-drive encoding (Level 2 and/or level 4) based on the write data written to the local drive and the received read data. For example, Reed-Solomon (RS) code is used for calculating the parity data. Then, in step 910, storage host 140 transmits a Write Command and the parity data to part of the other drives 110 that are configured to store parity data (e.g., Drives d−1 and d in FIG. 5). Upon receiving the Write Command and the parity data, in step 911, the part of the other drives 110 writes the parity data in a physical location thereof, which is determined according to a predetermined algorithm by the part of the other drives 110. After the parity data have been written into the physical location(s), in step 912, the part of the other drives 110 transmits the physical location(s) to the storage host 140.

Storage host 140 receives the physical location into which the write data have been written in step 913 and the physical locations(s) into which the parity data have been written in step 914. After receiving the physical locations, in step 915, storage host 140 updates LUT 1001 based on the received physical locations, and the method 900 ends. Here, the order of the steps to receive the physical locations of the write data and the parity data is not limited to the order shown in FIG. 11, and may be reversed. Further, the update of LUT 1001 may be carried out each time storage host 140 receives a physical locations from an SSD 110 (i.e., after step 913 and after step 914). In addition, global encoding (Level 2.5 and/or Level 4.5) may be also performed in addition to the intra-drive encoding carried out in step 909.

Data storage server 100a according to the present embodiment may also carry out a copy operation, which includes an operation to transfer data stored in a physical location of an SSD 110 another physical location of the SSD and an operation to transfer data stored in an SSD 110 to another SSD 110. Similarly to the data writing operation, in accordance with the transfer of data, storage host 140 calculates parity data of the transfer data using data stored in the other drives and writes the parity data into part of the other drives for storing party data. Then, storage host 140 receives a new physical location of the transferred data and the physical location(s) of the parity data from the SSDs 110, and update LUT 1001 based on the received physical addresses.

According to the present embodiment, data storage server 100a may carry out ECC encoding/decoding similarly to the configuration of ECC encoding/decoding schemes employed in the first embodiment. Through these encoding/decoding process, reliability of data stored in data storage server 100a can be improved because error correction can be performed more extensively. Further, in the present embodiment, storage host 140 manages mapping between ID of data (frame ID) and physical locations of SSDs 110. As no table for the mapping is necessary in each of SSDs 110, a mapping process (or an address conversion process) can be centrally carried out at storage host 140, which can usually perform processing at a faster speed than SSDs 110. Further, since no storage space for the mapping table is necessary in each of SSD 110, configurations of SSD 110 can be more simplified.

While the foregoing is directed to embodiments of the present invention, other and further embodiments of the invention may be devised without departing from the basic scope thereof, and the scope thereof is determined by the claims that follow.

We claim:

1. A storage host configured to communicate with a plurality of data storage drives, comprising:
   a processor configured to
      issue, to a target data storage drive, a read command indicating a physical location in the target data storage drive,
      upon receipt of data that are read from the physical location of the target data storage drive and subjected to an error correction by the target data storage drive, issue, to each of a plurality of non-target data storage drives, a read command indicating a physical location in said each of the non-target data storage drives, and
      upon receipt of data read from the physical locations of the non-target data storage drives, perform further error correction on the data received from the target data storage drive using the data received from the non-target data storage drives.

2. The storage host of claim 1, wherein the data received from the target data storage drive include user data and first parity data of the user data, and the data received from the non-target data storage drives include second parity data of the user data.

3. The storage host of claim 1, wherein when the data received from the target data storage device are not fully and only partially corrected through the further error correction, the processor issues, to each of the target data storage drive and the non-target data storage drives, an error correction command, in response to which data that have been subjected to an additional error correction by said each of the target data storage drive and the non-target data storage drives in accordance with the error correction command, is received from each of the target data storage drive and the non-target data storage drives.

4. The storage host of claim 3, wherein when the data received from the target data storage device are not fully and only partially corrected through the additional error correction by the target data storage drive, the processor performs the further error correction again on the data that have been subjected to the additional error correction by the target data storage drive, using the data that have been subjected to the additional error correction by the non-target data storage drives.

5. The storage host of claim 1, wherein each of the data storage drives comprises a controller configured to perform the error correction based on user data and parity data stored in said each data storage drive.

6. The storage host of claim 5, wherein the controller of each data storage drive is configured to perform the error correction based on a first hard decoding operation, and the processor of the storage host is configured to perform said further error correction based on a second hard decoding operation.

7. The storage host of claim 5, wherein the controller of each data storage drive is configured to perform the error correction based on a first soft decoding operation, and the processor in the storage host is configured to perform said further error correction based on a second soft decoding operation.

8. The storage host of claim 5, wherein the controller of each data storage drive is configured to perform the error correction based on a first hard decoding operation and a first soft decoding operation, and the processor in the storage host is configured to perform said further error correction based on a second hard decoding operation and a second soft decoding operation.

9. The storage host of claim 1, wherein the processor is configured to select one of a first error correction operation and a second error correction operation to perform the further error correction, based on a current workload of the processor.

10. The storage host of claim 9, wherein the first error correction operation comprises a hard decoding operation and the second error correction operation comprises a soft decoding operation.

11. A method of error correction in a memory system that includes a plurality of data storage drives and a storage host, the method comprising:
transmitting, from the storage host to a target data storage drive among the plurality of data storage drives, a read command and a physical location in the target data storage drive;
receiving, at the storage host, data that are read from the target data storage drive and have been subjected to an error correction by the target data storage drive;
transmitting, from the storage host to each of a plurality of non-target data storage drives among the plurality of data storage drives, a read command and a physical location in said each of the non-target data storage drives;
receiving, at the storage host, data read from the physical locations of the non-target data storage drives; and
performing, in the storage host, further error correction on the data received from the target data storage drive using the data received from the non-target data storage drives.

12. The method of claim 11, wherein the data received from the target data storage drive include user data and first parity data of the user data, and the data received from the non-target data storage drives include second parity data of the user data.

13. The method of claim 11, further comprising:
when the data received from the target data storage device are not fully and only partially corrected through the further error correction, transmitting, from the storage host to each of the target data storage drive and the non-target data storage drives, an error correction command, and
receiving, at the storage host, data that have been subjected to an additional error correction by said each of the target data storage drive and the non-target data storage drives in accordance with the error correction command.

14. The method of claim 13, further comprising:
when the data received from the target data storage device are not fully and only partially corrected through the additional error correction by the target data storage drive, performing, at the storage host, the further error correction again on the data that have been subjected to the additional error correction by the target data storage drive, using the data that have been subjected to the additional error correction by the non-target data storage drives.

15. The method of claim 11, wherein the storage host further comprises a processor, the method further comprising: selecting one of a first error correction operation and a second error correction operation to perform the further error correction, based on a current workload of the processor.

16. A storage host configured to communicate with a plurality of data storage drives, the storage host comprising:
a memory that stores index data; and a processor configured to:
issue, to a target data storage drive, a write command for writing write data, the write data being associated with an ID in the index data, and
generate parity data based on the write data and data read from physical locations of a plurality of non-target data storage drives, that correspond to the ID.

17. The storage host according to claim 16, wherein the target data storage drive is further configured to generate intra-drive parity data based on the write data and other data stored in the target data storage drive.

18. The storage host according to claim 16, wherein the processor is further configured to, upon receipt of a physical location of the target data storage drive into which the write data are written, update the index data, such that the index data indicates correspondence between the physical location of the target data storage drive and the ID.

19. The storage host according to claim 16, wherein the processor is further configured to issue, to at least one non-target data storage drives, a write command for writing the parity data, and upon receipt of a physical location of said at least one non-target data storage drive into which the parity data are written, update the index data, such that the index data indicates correspondence between the physical locations of said at least one non-target data storage drive and the ID.

20. The storage host according to claim 16, wherein the data received from the non-target data storage drives have been subjected to error correction by each of the non-target data storage drives.

* * * * *